United States Patent [19]

Yamakawa

[11] Patent Number: 4,914,614
[45] Date of Patent: Apr. 3, 1990

[54] MULTIVALUED ALU

[75] Inventor: Takeshi Yamakawa, Kumamoto, Japan

[73] Assignee: Omron Tateisi Electronics Co., Kyoto, Japan

[21] Appl. No.: 21,005

[22] Filed: Mar. 2, 1987

[30] Foreign Application Priority Data

| Mar. 4, 1986 [JP] | Japan | 61-45464 |
|---|---|---|
| Mar. 4, 1986 [JP] | Japan | 61-45469 |
| Mar. 4, 1986 [JP] | Japan | 61-45470 |

[51] Int. Cl.⁴ .......................... G06F 7/00; G06F 15/00
[52] U.S. Cl. .................................. 364/746.2; 365/168
[58] Field of Search ............................ 364/716, 746.2; 307/465; 340/825.77–825.79, 825.83, 825.87; 365/168

[56] References Cited

U.S. PATENT DOCUMENTS

| 3,656,117 | 4/1972 | Maley et al. | 365/168 |
|---|---|---|---|
| 4,202,044 | 5/1980 | Beilstein, Jr. et al. | 365/184 |
| 4,327,424 | 4/1982 | Wu | 365/168 |
| 4,348,736 | 9/1982 | Weinberger | 364/716 |
| 4,378,595 | 3/1983 | Current | 365/168 |
| 4,620,188 | 10/1986 | Sengchanh | 364/773 |

Primary Examiner—David L. Clark
Assistant Examiner—Dale M. Shaw
Attorney, Agent, or Firm—Stevens, Davis, Miller & Mosher

[57] ABSTRACT

A multivalued ALU is composed of a multivalued signal source, a memory array, a selection array, an AND array and an output circuit. The multivalued signal source generates signals each of which represents a logic value of multivalued logic. The memory array is provided with an address line group for each and every function to be implemented, each address line group comprising a number of address lines. Which multivalued logic signals will appear on the address lines of each address line group depends upon a program based on the truth table of the corresponding function. Any one of the plural address line groups is selected by the selection array, to which a signal designating the function to be implemented is applied. One address line in the selected address line group is selected by the AND array, which has an input signal applied thereto, and the logic value signal on the selected line is delivered via the output circuit.

15 Claims, 37 Drawing Sheets

| y\x | 0 | 1 | 2 | 3 |
|---|---|---|---|---|
| 0 | 3 | 2 | 0 | 1 |
| 1 | 0 | 1 | 3 | 1 |
| 2 | 1 | 1 | 1 | 1 |
| 3 | 3 | 3 | 2 | 0 |

Z = 1

| y\x | 0 | 1 | 2 | 3 |
|---|---|---|---|---|
| 0 | 1 | 3 | 1 | 2 |
| 1 | 1 | 0 | 0 | 1 |
| 2 | 0 | 0 | 2 | 0 |
| 3 | 2 | 2 | 3 | 2 |

Z = 2

| y\x | 0 | 1 | 2 | 3 |
|---|---|---|---|---|
| 0 | 2 | 2 | 2 | 2 |
| 1 | 2 | 2 | 2 | 2 |
| 2 | 2 | 2 | 2 | 2 |
| 3 | 2 | 2 | 2 | 2 |

Z = 3

| y\x | 0 | 1 | 2 | 3 |
|---|---|---|---|---|
| 0 | 2 | 1 | 3 | 1 |
| 1 | 1 | 0 | 3 | 0 |
| 2 | 0 | 2 | 2 | 0 |
| 3 | 3 | 3 | 2 | 1 |

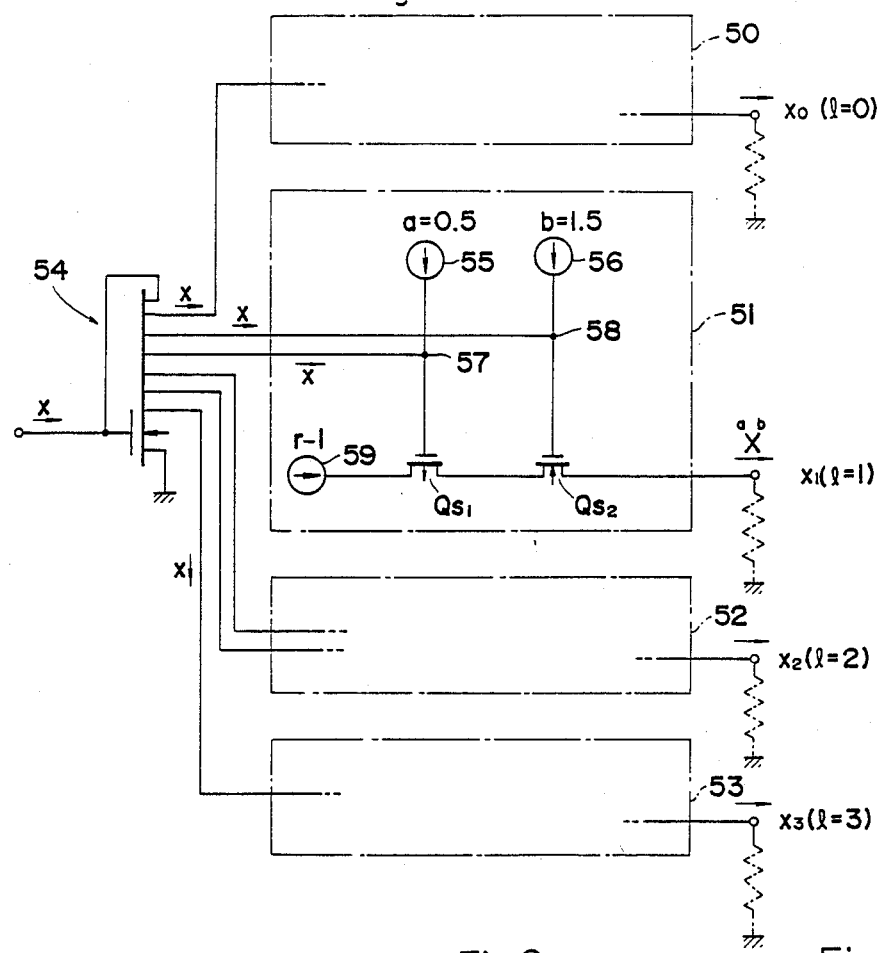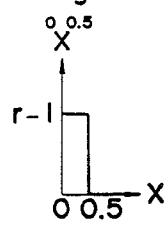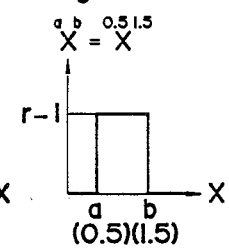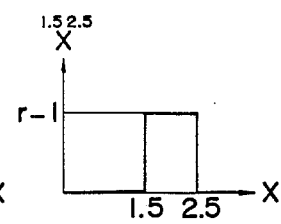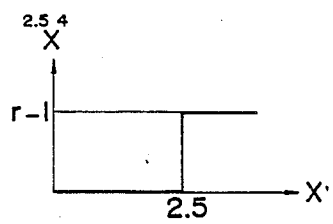

| y\x | 0 | | 1 | | 2 | | 3 | |
|---|---|---|---|---|---|---|---|---|
| 0 | 0 | 3 | 0 | 3 | 0 | 3 | 0 | 3 |
|   | 3 | 0 | 2 | 1 | 1 | 2 | 0 | 3 |
| 1 | 0 | 3 | 3 | 1 | 3 | 1 | 0 | 3 |
|   | 2 | 1 | 3 | 2 | 2 | 3 | 1 | 2 |
| 2 | 0 | 3 | 3 | 1 | 3 | 1 | 0 | 3 |
|   | 1 | 2 | 2 | 3 | 3 | 2 | 2 | 1 |
| 3 | 0 | 3 | 0 | 3 | 0 | 3 | 0 | 3 |
|   | 0 | 3 | 1 | 2 | 2 | 1 | 3 | 0 |

|   | A | I | F_out |
|---|---|---|---|

$F_{in} = 0$

| y\x | 0 | 1 | 2 | 3 |
|---|---|---|---|---|
| 0 | 0 | 1 | 2 | 3 |
| 1 | 1 | 1 | 2 | 3 |
| 2 | 2 | 2 | 2 | 3 |
| 3 | 3 | 3 | 3 | 3 |

| y\x | 0 | 1 | 2 | 3 |
|---|---|---|---|---|
| 0 | 0 | 0 | 0 | 0 |
| 1 | 0 | 1 | 1 | 1 |
| 2 | 0 | 1 | 2 | 2 |
| 3 | 0 | 1 | 2 | 3 |

| y\x | 0 | 1 | 2 | 3 |
|---|---|---|---|---|
| 0 | 0 | 2 | 2 | 2 |
| 1 | 1 | 0 | 2 | 2 |
| 2 | 1 | 1 | 0 | 2 |
| 3 | 1 | 1 | 1 | 0 |

$F_{in} = 1$

| y\x | 0 | 1 | 2 | 3 |
|---|---|---|---|---|
| 0 | 0 | 0 | 0 | 0 |
| 1 | 1 | 1 | 1 | 1 |
| 2 | 2 | 2 | 2 | 2 |
| 3 | 3 | 3 | 3 | 3 |

| y\x | 0 | 1 | 2 | 3 |
|---|---|---|---|---|
| 0 | 0 | 1 | 2 | 3 |
| 1 | 0 | 1 | 2 | 3 |
| 2 | 0 | 1 | 2 | 3 |
| 3 | 0 | 1 | 2 | 3 |

| y\x | 0 | 1 | 2 | 3 |
|---|---|---|---|---|
| 0 |   |   |   |   |
| 1 |   |   |   |   |
| 2 |   | 1 |   |   |
| 3 |   |   |   |   |

$F_{in} = 2$

| y\x | 0 | 1 | 2 | 3 |
|---|---|---|---|---|
| 0 | 0 | 1 | 2 | 3 |
| 1 | 0 | 1 | 2 | 3 |
| 2 | 0 | 1 | 2 | 3 |
| 3 | 0 | 1 | 2 | 3 |

| y\x | 0 | 1 | 2 | 3 |
|---|---|---|---|---|
| 0 | 0 | 0 | 0 | 0 |
| 1 | 1 | 1 | 1 | 1 |
| 2 | 2 | 2 | 2 | 2 |
| 3 | 3 | 3 | 3 | 3 |

| y\x | 0 | 1 | 2 | 3 |
|---|---|---|---|---|
| 0 |   |   |   |   |
| 1 |   |   |   |   |
| 2 |   | 2 |   |   |
| 3 |   |   |   |   | x, y : INPUT
S : SUM
$C_{in}$ : CARRY-IN
$C_{out}$ : CARRY $C_{in} + x + y = C_{out} S$ $(x_3 x_2 x_1 x_0) + (y_3 y_2 y_1 y_0) = (C_{out3} S_3 S_2 S_1 S_0)$

| y\x | 0 | 1 | 2 | 3 |
|---|---|---|---|---|
| 0 | 0 | 1 | 2 | 3 |
| 1 | 1 | 2 | 3 | 0 |
| 2 | 2 | 3 | 0 | 1 |
| 3 | 3 | 0 | 1 | 2 |

Cout

| y\x | 0 | 1 | 2 | 3 |
|---|---|---|---|---|
| 0 | 0 | 0 | 0 | 0 |
| 1 | 0 | 0 | 0 | 1 |
| 2 | 0 | 0 | 1 | 1 |
| 3 | 0 | 1 | 1 | 1 |

$C_{in} = 1$

| y\x | 0 | 1 | 2 | 3 |
|---|---|---|---|---|
| 0 | 1 | 2 | 3 | 0 |
| 1 | 2 | 3 | 0 | 1 |
| 2 | 3 | 0 | 1 | 2 |
| 3 | 0 | 1 | 2 | 3 |

| y\x | 0 | 1 | 2 | 3 |
|---|---|---|---|---|
| 0 | 0 | 0 | 0 | 1 |
| 1 | 0 | 0 | 1 | 1 |
| 2 | 0 | 1 | 1 | 1 |
| 3 | 1 | 1 | 1 | 1 |

| y\x | 0 | 1 | 2 | 3 |
|---|---|---|---|---|
| 0 | 0 | 1 | 2 | 3 |
| 1 | 3 | 0 | 1 | 2 |
| 2 | 2 | 3 | 0 | 1 |
| 3 | 1 | 2 | 3 | 0 |

$B_{out}$

| y\x | 0 | 1 | 2 | 3 |
|---|---|---|---|---|
| 0 | 0 | 0 | 0 | 0 |
| 1 | 1 | 0 | 0 | 0 |
| 2 | 1 | 1 | 0 | 0 |
| 3 | 1 | 1 | 1 | 0 |

$B_{in} = 1$

| y\x | 0 | 1 | 2 | 3 |
|---|---|---|---|---|
| 0 | 3 | 0 | 1 | 2 |
| 1 | 2 | 3 | 0 | 1 |
| 2 | 1 | 2 | 3 | 0 |
| 3 | 0 | 1 | 2 | 3 |

| y\x | 0 | 1 | 2 | 3 |
|---|---|---|---|---|
| 0 | 1 | 0 | 0 | 0 |
| 1 | 1 | 1 | 0 | 0 |
| 2 | 1 | 1 | 1 | 0 |
| 3 | 1 | 1 | 1 | 1 |

$(x_3 x_2 x_1 x_0) - (y_3 y_2 y_1 y_0) = (S D_3 D_2 D_1 D_0)$ $\begin{cases} S = 2 : (+) \; x > y \\ S = 0 : (0) \; x = y \\ S = 1 : (-) \; x < y \end{cases}$

$B_{out}$:
| y\x | 0 | 1 | 2 | 3 |
|---|---|---|---|---|
| 0 | 0 | 1 | 1 | 1 |
| 1 | 0 | 0 | 1 | 1 |
| 2 | 0 | 0 | 0 | 1 |
| 3 | 0 | 0 | 0 | 0 |

$F_{out}$: 0

$B_{in}=1$:
D:
| y\x | 0 | 1 | 2 | 3 |
|---|---|---|---|---|
| 0 | 3 | 2 | 1 | 0 |
| 1 | 0 | 3 | 2 | 1 |
| 2 | 1 | 0 | 3 | 2 |
| 3 | 2 | 1 | 0 | 3 |

$B_{out}$:
| y\x | 0 | 1 | 2 | 3 |
|---|---|---|---|---|
| 0 | 1 | 1 | 1 | 1 |
| 1 | 0 | 1 | 1 | 1 |
| 2 | 0 | 0 | 1 | 1 |
| 3 | 0 | 0 | 0 | 1 |

$F_{out}$: 0

$F_{in}=1$
$B_{in}=0$:
D:
| y\x | 0 | 1 | 2 | 3 |
|---|---|---|---|---|
| 0 | 0 | 3 | 2 | 1 |
| 1 | 1 | 0 | 3 | 2 |
| 2 | 2 | 1 | 0 | 3 |
| 3 | 3 | 2 | 1 | 0 |

$B_{out}$:
| y\x | 0 | 1 | 2 | 3 |
|---|---|---|---|---|
| 0 | 0 | 1 | 1 | 1 |
| 1 | 0 | 0 | 1 | 1 |
| 2 | 0 | 0 | 0 | 1 |
| 3 | 0 | 0 | 0 | 0 |

$F_{out}$: 1

$B_{in}=1$:
D:
| y\x | 0 | 1 | 2 | 3 |
|---|---|---|---|---|
| 0 | 3 | 2 | 1 | 0 |
| 1 | 0 | 3 | 2 | 1 |
| 2 | 1 | 0 | 3 | 2 |
| 3 | 2 | 1 | 0 | 3 |

$B_{out}$:
| y\x | 0 | 1 | 2 | 3 |
|---|---|---|---|---|
| 0 | 1 | 1 | 1 | 1 |
| 1 | 0 | 1 | 1 | 1 |
| 2 | 0 | 0 | 1 | 1 |
| 3 | 0 | 0 | 0 | 1 |

$F_{out}$: 1

$F_{in}=2$
$B_{in}=0$:
D:
| y\x | 0 | 1 | 2 | 3 |
|---|---|---|---|---|
| 0 | 0 | 1 | 2 | 3 |
| 1 | 3 | 0 | 1 | 2 |
| 2 | 2 | 3 | 0 | 1 |
| 3 | 1 | 2 | 3 | 0 |

$B_{out}$:
| y\x | 0 | 1 | 2 | 3 |
|---|---|---|---|---|
| 0 | 0 | 0 | 0 | 0 |
| 1 | 1 | 0 | 0 | 0 |
| 2 | 1 | 1 | 0 | 0 |
| 3 | 1 | 1 | 1 | 0 |

$F_{out}$: 2

$B_{in}=1$:
D:
| y\x | 0 | 1 | 2 | 3 |
|---|---|---|---|---|
| 0 | 3 | 0 | 1 | 2 |
| 1 | 2 | 3 | 0 | 1 |
| 2 | 1 | 2 | 3 | 0 |
| 3 | 0 | 1 | 2 | 3 |

$B_{out}$:
| y\x | 0 | 1 | 2 | 3 |
|---|---|---|---|---|
| 0 | 1 | 0 | 0 | 0 |
| 1 | 1 | 1 | 0 | 0 |
| 2 | 1 | 1 | 1 | 0 |
| 3 | 1 | 1 | 1 | 1 |

$F_{out}$: 2 x, y : INPUT
P : PRODUCT
$C_{in}$ : CARRY-IN
$C_{out}$ : CARRY $$x \times y + C_{in} = C_{out}P$$

$$(x_3 x_2 x_1 x_0) \times y_0 = (C_{out3} P_3 P_2 P_1 P_0)$$
$$= (P_4 P_3 P_2 P_1 P_0)$$

| y\x | 0 | 1 | 2 | 3 |
|---|---|---|---|---|
| 0 | 0 | 0 | 0 | 0 |
| 1 | 0 | 1 | 2 | 3 |
| 2 | 0 | 2 | 0 | 2 |
| 3 | 0 | 3 | 2 | 1 |

$C_{out}$

| y\x | 0 | 1 | 2 | 3 |
|---|---|---|---|---|
| 0 | 0 | 0 | 0 | 0 |
| 1 | 0 | 0 | 0 | 0 |
| 2 | 0 | 0 | 1 | 1 |
| 3 | 0 | 0 | 1 | 2 |

$C_{in}=1$

| y\x | 0 | 1 | 2 | 3 |
|---|---|---|---|---|
| 0 | 1 | 1 | 1 | 1 |
| 1 | 1 | 2 | 3 | 0 |
| 2 | 1 | 3 | 1 | 3 |
| 3 | 1 | 0 | 3 | 2 |

| y\x | 0 | 1 | 2 | 3 |
|---|---|---|---|---|
| 0 | 0 | 0 | 0 | 0 |
| 1 | 0 | 0 | 0 | 1 |
| 2 | 0 | 0 | 1 | 1 |
| 3 | 0 | 1 | 1 | 2 |

$C_{in}=2$

| y\x | 0 | 1 | 2 | 3 |
|---|---|---|---|---|
| 0 | 2 | 2 | 2 | 2 |
| 1 | 2 | 3 | 0 | 1 |
| 2 | 2 | 0 | 2 | 0 |
| 3 | 2 | 1 | 0 | 3 |

| y\x | 0 | 1 | 2 | 3 |
|---|---|---|---|---|
| 0 | 0 | 0 | 0 | 0 |
| 1 | 0 | 0 | 1 | 1 |
| 2 | 0 | 1 | 1 | 2 |
| 3 | 0 | 1 | 2 | 2 | x,y : INPUT
Q : QUOTIENT
$B_{in}$ : BORROW
R : REMAINDER $(B_{in} \times r + x) \div y = Q \overset{\text{REMAINDER}}{R}$ $(x_3 x_2 x_1 x_0) \div y_0 = (Q_3 Q_2 Q_1 Q_0) \overset{\text{REMAINDER}}{R_0}$

| y\x | 0 | 1 | 2 | 3 |
|---|---|---|---|---|
| 0 |   |   |   |   |
| 1 | 0 | 1 | 2 | 3 |
| 2 | 0 | 0 | 1 | 1 |
| 3 | 0 | 0 | 0 | 1 |

$B_{in} = 1$

| y\x | 0 | 1 | 2 | 3 |
|---|---|---|---|---|
| 0 |   |   |   |   |
| 1 |   |   |   |   |
| 2 | 2 | 2 | 3 | 3 |
| 3 | 1 | 1 | 2 | 2 |

$B_{in} = 2$

| y\x | 0 | 1 | 2 | 3 |
|---|---|---|---|---|
| 0 |   |   |   |   |
| 1 |   |   |   |   |
| 2 |   |   |   |   |
| 3 | 2 | 3 | 3 | 3 |

R $B_{in} = 0$

| y\x | 0 | 1 | 2 | 3 |
|---|---|---|---|---|
| 0 |   |   |   |   |
| 1 | 0 | 0 | 0 | 0 |
| 2 | 0 | 1 | 0 | 1 |
| 3 | 0 | 1 | 2 | 0 |

$B_{in} = 1$

| y\x | 0 | 1 | 2 | 3 |
|---|---|---|---|---|
| 0 |   |   |   |   |
| 1 |   |   |   |   |
| 2 | 0 | 1 | 0 | 1 |
| 3 | 1 | 2 | 0 | 1 |

$B_{in} = 2$

| y\x | 0 | 1 | 2 | 3 |
|---|---|---|---|---|
| 0 |   |   |   |   |
| 1 |   |   |   |   |
| 2 |   |   |   |   |
| 3 | 2 | 0 | 1 | 2 |

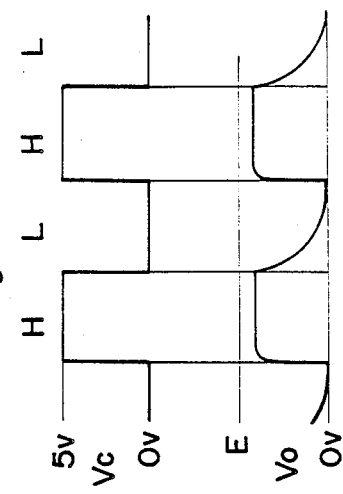
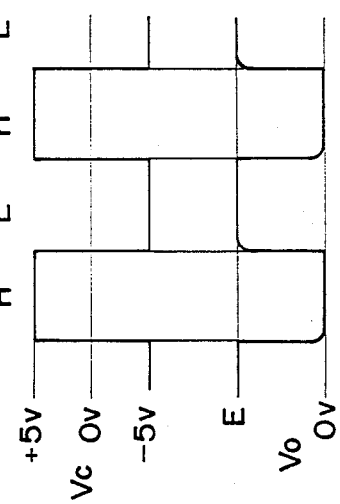
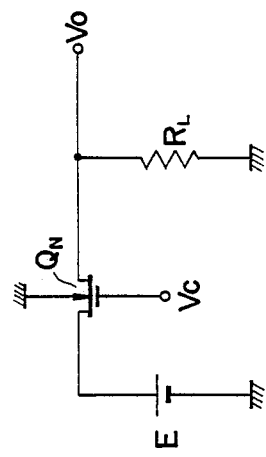
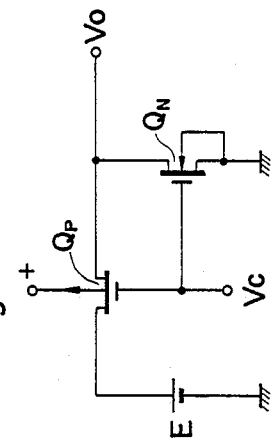
Fig.53b
Fig.54b
Fig.53a
Fig.54a

MULTIVALUED ALU

BACKGROUND OF THE INVENTION

This invention relates to a programmable multivalued ALU (arithmetic and logic unit), which is a fundamental building block for constructing a multivalued logic system, and which readily lends itself to integrated circuit techniques.

Extensive research in the field of multivalued logic and associated arithmetic circuits is underway with the aim of compensating for or overcoming the several limitations of 2-valued (binary) logic, which is the foundation of many digital circuit systems, the foremost of which is the computer. Whereas 2-valued logic deals with the two values 0 and 1 and the signals employed by a 2-valued logic circuit system have two levels corresponding to these two values, multivalued logic deals with three or more values and the signals used by a multivalued logic circuit system have three or more levels.

Multivalued logic (and a multivalued logic circuit system) has the following advantages over two-valued logic (and a two-valued logic circuit system):

(1) It is possible to describe an indeterminate state between 0 and 1 (as by employing three values).

(2) The wiring area on an IC substrate and the number of pins can be reduced to enable a higher degree of effective integration. In the case of 64 values, for instance, one sixth the wiring area of a two-valued logic circuit is sufficient.

(3) The realization of a 10-valued (decimal) machine would make it possible to employ logic the same as that used by human beings, so that the encoders and decoders required by two-valued machines would be unnecessary.

The most fundamental building block for constructing a multivalued logic system having these advantages, particularly a system supplanting the conventional 2-valued computer, is a multivalued ALU. A multivalued ALU must be an ALU capable of performing any multivalued logical operation. There are ten types of multivalued logical operations even if we consider only those that are well known, such as MAX, MIN, addition, subtraction, multiplication and division. For n values and r variables, the number of types of multivalued logical operations that exists is n raised to the $n^r$ power (i.e. $n^{n^r}$). For example, if there are three values and two variables, the number of types of multivalued logical operations is $3^{3^2}$; if there are four values and two vriables, the number of types of multivalued logical operations is approximately $4.3 \times 10^9$. A multivalued ALU capable of executing such an enormous number of multivalued logical operations is virtually impossible to design in the ordinary manner.

SUMMARY OF THE INVENTION

An object of the present invention is to provide a programmable multivalued ALU capable of executing any operation.

Another object of the present invention is to readily obtain a multivalued logic function circuit for performing an operation in accordance with a truth table of a multivalued logic function when such a truth table is given, the circuit being used in order to realize the abovementioned multivalued ALU.

A further object of the present invention is to obtain a multiple-function circuit, namely a multivalued logic function circuit for performing operations in accordance with truth tables of multivalued logic functions when such truth tables are given, wherein a plurality of different ones of the multivalued logic operations can be performed simultaneously, the circuit being used in order to realize the abovementioned multivalued ALU.

Still another object of the present invention is to provide a simply constructed multivalued memory suitable for construction of a multivalued computer system.

A multivalued logic function circuit in accordance with the present invention comprises: a plurality of multivalued signal sources for generating signals respectively representing a plurality of logic values of applied multivalued logic; a memory array including a plurality of signal lines connected to respective ones of the signal sources, and a plurality of address lines each connected to any one of the signal lines at a node by being programmed in accordance with a given truth table; an addressed switch for selectively rendering any one of the address lines conductive by a multivalued input signal; and an output line connected to all of the address lines on the output side of the addressed switch.

In case of a field programmable circuit, only the memory array is programmed in accordance with the truth table. For most mask-programmable circuits, the memory array and addressed switch would be programmed.

In any case, it will suffice to write a program in accordance with a truth table, and programming can readily be accomplished if a truth table is given. A circuit for implementing any multivalued logic function is thus realized.

A multivalued memory according to the present invention comprises a plurality of signal lines connected to respective ones of a plurality of multivalued signal sources for generating signals respectively representing a plurality of logic values of applied multivalued logic, and a plurality of address lines each connected to any one of the signal lines at a node by being programmed.

When the multivalued memory is used, it is possible, by designating desired address lines, to obtain from the address lines multivalued signals representing previously programmed values. Since current or voltage sources can be used as the signal sources, it is possible to extract a multivalued voltage signal or multivalued current signal from the multivalued memory.

It will be readily understood that the multivalued memory of the invention can be utilized in order to realize the abovementioned multivalued logic function circuit.

A multivalued ALU in accordance with the present invention comprises: a plurality of multivalued signal sources for generating signals respectively representing a plurality of logic values of applied multivalued logic; a memory array including a plurality of signal lines connected to respective ones of the signal sources, and a plurality of address line groups provided for respective ones of different functions to be implemented, each group comprising a plurality of address lines each connected to any one of the signal lines at a node by being programmed in accordance with a truth table of each function; first selecting means for selecting any one of the address line groups by a selection signal which is for selecting a function to be implemented; second selecting means for selecting at least one of the address line in the selected address line group by a multivalued input signal; and an output circuit for outputting a signal representing a logic value obtained from the address line selected by the first and second selecting means.

Execution of the multivalued logic operation is equivalent generation of a multivalued logic function representing the results of the operation. Plural types of desired multivalued logic functions can be readily programmed in the abovementioned memory array in accordance with the truth tables thereof. One multivalued logic function among the plurality thereof can be selected by the first selecting means. By applying an input signal representing a variable, a signal representing a function value corresponding to the variable can be obtained from the selected multivalued logic function.

Thus, it is possible by using truth tables to program a multivalued ALU which implements any multivalued logic function, and programmed operation results can be derived by operating the multivalued ALU.

These and other characterizing features of the present invention will become clear from a description of preferred embodiments with reference to the accompanying drawings.

BRIEF DESCRIPTION OF THE DRAWINGS

FIG. 1 is a view illustrating examples of truth tables of a 4-value 3-input multivalued logic function;

FIG. 8 is a circuit diagram showing a specific example of a decoder operated in a current mode;

FIGS. 9a through 9d are graphs of output signals from the circuit of FIG. 8;

FIG. 22 is a view showing truth tables of a 4-valued MAX/MIN function;

FIG. 27 is a view showing truth tables of 4-valued full addition;

FIG. 32 is a view illustrating truth tables of 4-valued full subtraction in a full subtracter circuit of the first type;

FIG. 39 is a view showing truth tables of 4-valued full substraction in the full subtracter circuit of the second type;

FIG. 42 is a view showing truth tables of 4-valued full multiplication;

FIG. 49 is a view showing truth tables of 4-valued full division;

FIG. 53a illustrates an n-channel MOSFET switching circuit;

FIG. 53b illustrates waveforms associated with the circuit of FIG. 53a;

FIG. 54a illustrates a CMOSFET switching circuit;

FIG. 54b illustrates waveforms associated with the circuit of FIG. 54a;

DESCRIPTION OF THE PREFERRED EMBODIMENTS

Figures 2, 3:
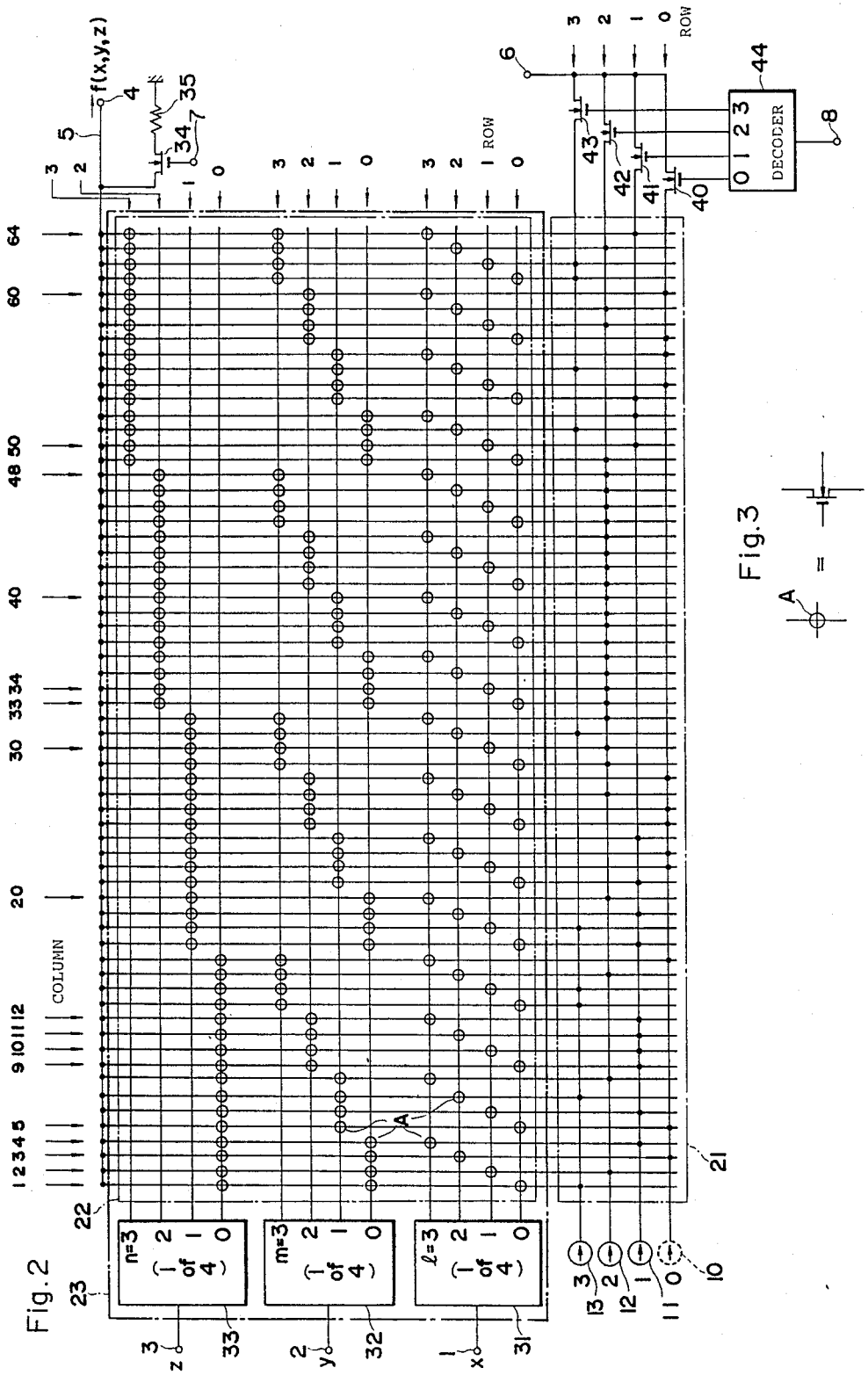
FIG. 2 is a circuit diagram illustrating a multivalued logic function circuit which outputs a multivalued function expressed by the truth tables shown in FIG. 1.
FIG. 3 is a view for describing a symbol used in FIG. 2.

(1) Definition of a multivalued logic function

A multivalued logic function can be defined in two ways. One method is to use an equation that expresses the function. For example, a multivalued logic function MAX in which x and y are variables is expressed by the following:

$$\text{MAX}(x,y) = \begin{cases} x & (x \geq y) \\ y & (x < y) \end{cases} \quad (1)$$

and a multivalued logic function MIN in which x and y are variables is expressed by the following:

$$\text{MIN}(x,y) = \begin{cases} y & (x \geq y) \\ x & (x < y) \end{cases} \quad (2)$$

The other method of defining a multivalued logic function is to use a truth table. FIG. 1 illustrates an example of truth tables of a multivalued logic function (a 4-value function) having the three variables x, y and z each of which takes on the four values of 0, 1, 2 and 3. Since any value can be written in a truth table, using the truth table makes it possible to readily define any multivalued logic function. Whereas there is a limitation on the types of functions capable of being defined in accordance with the definition method that relies upon an equation of the function, all functions can be defined if truth tables are utilized. This is a significant advantage of the method using truth tables. Furthermore, since a function defined using an equation can be replaced by a truth table, the method using truth tables can be said to subsume the method relying upon equations. Accordingly, in the description that follows, multivalued logic functions are in principle defined by using truth tables.

It is possible for a multivalued logic function defined by a truth table to be expressed by the formula given below using the values in the truth table. Specifically, a multivalued logic function f(x,y,z) in which x, y and z are variables is expressed by the following if the value in the truth table is $C_{lmn}$:

$$f(x,y,z) = \Sigma\Sigma\Sigma C_{lmn} * \{k_l(x) \cdot k_m(y) \cdot k_n(z)\} \quad (3)$$

where $$k_l(x) = \begin{cases} 1 & (x = l) \\ 0 & (x \neq l) \end{cases}$$

$$k_m(y) = \begin{cases} 1 & (y = m) \\ 0 & (y \neq m) \end{cases}$$

$$k_n(z) = \begin{cases} 1 & (z = n) \\ 0 & (z \neq n) \end{cases}$$

If there are r values, x, y, z, l, m and n each take on the values 0, 1, . . . , (r−1).

In Eq. (3), the symbols "*" and "." both represent multiplication.

As for a multivalued logic function circuit which outputs a multivalued signal indicative of the function f(x,y,z) of Eq. (3), the variables x, y, z would be given by a multivalued input signal representing these values. The symbol "." would be realized by an AND logic operation, and the symbol "*" would be realized by switching.

In order to obtain an output signal representing any multivalued logic function by such a multivalued logic function circuit, the circuit must be programmable. Any multivalued logic function may be obtained by programming the abovementioned value $C_{lmn}$ of the truth table, i.e. by programming a circuit that generates the value $C_{lmn}$.

Two methods are available for programming a circuit that generates the value $C_{lmn}$ of a truth table. One method involves programming performed in the process of fabricating the circuit through IC manufacture, in which case the circuit is referred to as a mask-programmable circuit. The other is a method in which an unprogrammed circuit is programmed by the user using a PROM writer or the like. This circuit is referred to as a field-programmable circuit.

(2) Field-programmable multivalued logic function circuit

FIG. 2 shows a circuit which executes the operation expressed by Eq. (3) to obtain an output signal representing the function f(x,y,z). The value $C_{lmn}$ of the truth table is programmed in a field-programmable circuit.

The circuit of FIG. 2 is a 4-valued 3-input (3-variable) multivalued logic function circuit Though the circuit shown in FIG. 2 is capable of operating in either a current mode or voltage mode, the circuit will first be described premised on the current mode of operation. The circuit will then be described for a case where it has been switched over to the voltage mode of operation.

The multivalued logic function circuit shown in FIG. 2 includes four signal sources 10–13, a node memory array 21 connected to these signal sources 10–13, an addressed switch 23 connected to the memory array 21, and an output line 5 connected to the output side of the addressed switch 23.

The signal sources 10–13 are current sources the specific construction of which will be described later. Since the present embodiment is a 4-valued logic function circuit, the signal sources 10–13 output currents indicative of the four values 0, 1, 2 and 3, respectively. The current source 10 for the current representing the value 0 is not always necessary.

Lines (signal lines) connected to respective ones of the signal sources 10–13 in the node memory array 21 constitute rows and are referred to as 0th–3rd row lines, respectively. Lines (address lines) constituting 64 columns are arranged with respect to the lines forming these rows and are referred to as 1st column line, 2nd column line, ..., 64th column line, starting from the left side of FIG. 2. Each line forming a row and each line forming a column are connected to each other at only one location, thereby forming a node.

This memory array is of the field programmable-type and generally has its rows and columns arranged to cross each other three-dimensionally on a silicon chip. Like an ordinary programmable ROM, the memory array can be of the type in which the nodes are formed by an junction breakdown or insulation layer breakdown produced by application of a large current or voltage, the type in which fuses at unnecessary node portions are melted away to leave only the nodes that are necessary, etc. Any of these memory arrays can be employed.

In any event, the memory array 21 is programmed to have the values of a truth table representing the desired multivalued logic function, such as illustrated in FIG. 1. The 1st column line corresponds to $x=0$, $y=0$, $z=0$, the 2nd column line corresponds to $x=1$, $y=0$, $z=0$, the 3rd column line corresponds to $x=2$, $y=0$, $z=0$, the 9th column line corresponds to $x=0$, $y=2$, $z=0$, and so on. Thus, all columns are in one-to-one correspondence with all combinations of the variables x, y, z. Each column line is connected by a node to a row line from a current source representing the function f(x,y,z) in which the corresponding value of x, y, z is the variable, namely from a current source representing the value $C_{lmn}$ ($=C_{xyz}$) of the truth table.

The circuit combining the current sources 10–13 and the memory 21 is equivalent to 64 current sources.

Since the memory array 21 is programmable, it is possible to program values of any truth table. A circuit which outputs a signal representing any multivalued logic function f(x,y,z) may thus be realized.

The addressed switch 23 selectively extracts or reads (switches on) currents representing the function f(x,y,z), which has been set in the memory array 21, in dependence upon inputs x, y, z applied to input terminals 1, 2, 3, respectively. The addressed switch 23 includes decoders (1-of-4 decoders) 31, 32 and 33 to which the inputs x, y are z are respectively applied, and an AND array 22 connected to the output sides of these decoders. The decoder 31 outputs an H-level signal at its $l=0$ output terminal and an L-level signal at its other output terminals when the input x (irrespective of the current or voltage mode of operation) is indicative of the logic value 0. Similarly, when the input x is logical 1, 2, 3, the H-level signal output appears at the $l=1, 2, 3$ output terminal, respectively, with the other output terminals delivering the L level. The other decoders 32, 33 operate in the same manner.

Extending from each of the decoders 31, 32, 33 are control lines constituting four rows. These control lines intersect the column lines extending from the memory array 21 or connected to the column lines thereof. Provided at each intersection is a switching element comprising an n-channel MOSFET expressed by the by symbol ○ denoted by A (see FIG. 3). These switching elements A are connected serially in threes to each column line and are controlled by respective ones of the control lines constituting the rows extending from the decoders 31, 32, 33. The control lines that control the three switching elements in each column differ from one column to the next. For instance, when $x=0$, $y=0$, $z=0$ holds, all three switching elements in the 1st column turn on so that the line is rendered conductive. Similarly, the 2nd column line is rendered conductive when $x=1$, $y=0$, $z=0$ holds, the 3rd column line is rendered conductive when $x=2$, $y=0$, $z=0$ holds, and the 10th column line is rendered conductive when $x=1$, $y=2$, $z=0$ holds.

In other words, the addressed switch 23 is so adapted that among the 64 column lines, only the column line addressed by the combination of inputs x, y, z is rendered conductive. It goes without saying that the addressed switch 23 or at least the AND array 22 can be realized by integrated circuitry.

The 64 column lines are connected to the single output line 5 on the output side of the addressed switch 23. The output line 5 is provided with an output terminal 4 for the function f(x,y,z).

Accordingly, a column line designated by the inputs x, y z is rendered conductive by the addressed switch 23, so that the current of the previously programmed value flows through the designated column line from the corresponding node of the memory array 21 and then through the output line 5 to appear at the output terminal 4 as an output current representing the corresponding function f(x,y,z).

Figure 4A:
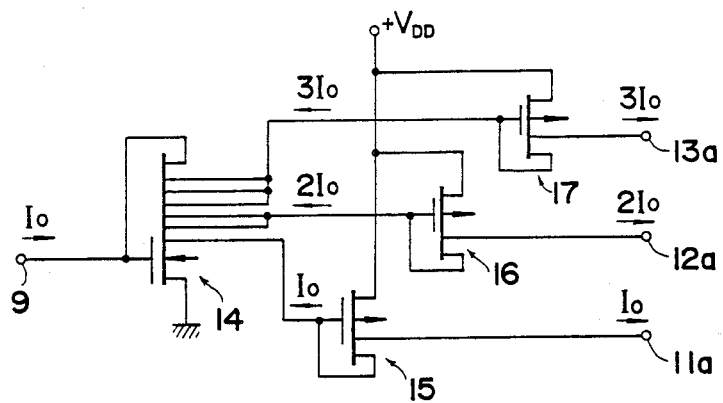
FIGS. 4a and 4b are circuit diagrams illustrating examples of a specific circuit construction of current signal sources shown in FIG. 2.
Figure 4B:
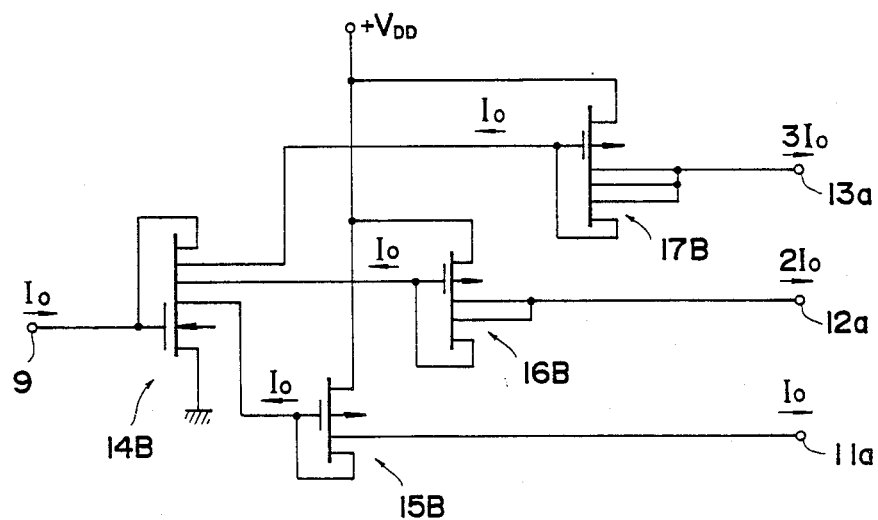

FIGS. 4a and 4b illustrate examples of the specific construction of current sources 11–13.

In the arrangement of FIG. 4a, a current I0 corresponding to the value 1 in multivalued logic is applied to an input terminal 9 and enters a six-output current mirror 14 comprising an n-channel MOSFET. One output current of the current mirror 14 has its direction reversed by a current mirror 15 comprising a p-channel MOSFET and appears as an output current $I_0$ at an output terminal 11a. This output current $I_0$ corresponds to the output current of the current source 11 shown in FIG. 2. Connecting together two of the output drains of the current mirror 14 forms a current of value $2I_0$, which is reversed by a current mirror 16 before appearing at an output terminal 12a. Connecting together the other three output drains of current mirror 14 produces a current of value $3I_0$, which is reversed by a current mirror 17 before appearing at an output terminal 13a. The output currents $2I_0$, $3I_0$ of the output terminals 12a, 13a correspond to the output currents from the current sources 12, 13, respectively, of FIG. 2.

In the arrangement of FIG. 4b, a three-output current mirror 14B outputs three currents of value $I_0$ applies to respective current mirrors 15B, 16B, 17B. Since the current mirror 15B is a one-output current mirror, it outputs a current the value of which is equal to that of the input current $I_0$. The current mirrors 16B and 17B are 2- and 3-output current mirrors, respectively, and each has its output drains connected together. As a result, these current mirrors provide currents of values $2I_0$, $3I_0$, respectively.

In FIG. 2, a series circuit composed of a switching element 34 comprising an n-channel MOSFET and a resistor 35 is connected in parallel with the output line 5. The resistor 35 is grounded. The switching element 34 has its on/off action controlled by a voltage signal applied to a mode select terminal 7.

If the circuit of FIG. 2 is to be operated in the current mode, as described above, then the switching element 34 is turned off in advance by applying an L-level voltage to the terminal 7.

If the circuit of FIG. 2 is to be operated in the voltage mode, then the switching element 34 is turned on in advance by applying an H-level voltage to the terminal 7. When this is done, the current indicative of the function $f(x,y,z)$ flows into the resistor 35 via the switching element 34, whereby a voltage drop is produced that appears at the output terminal 4. It is assumed here that the input impedance of the succeeding circuit (not shown) connected to the output terminal 4 is high. Thus, without altering the current sources 10–13 in any way (though it is preferred that the 0th row line connected to the current source 10 be grounded beforehand), it is possible to switch between the current mode of operation and voltage mode of operation merely by changing over the mode select signal applied to the terminal 7.

It is also permissible to connect the switching element 34 and resistor 35 to each row line of the memory array 21 rather than the output line 5. Furthermore, it goes without saying that the circuit of FIG. 2 can be converted into a voltage mode circuit if voltage sources are used instead of the current sources 10–13.

The arrangement of FIG. 2 is also provided with a circuit for programming the memory array 21. The circuit is composed of switching elements 40–43 connected at one terminal thereof to respective ones of the row lines of memory array 21, a terminal 6 connected to the switching elements 40–43 at the other terminal thereof, and a decoder 44 for generating a signal to control the on/off action of the switching elements 40–43. The decoder 44 has a terminal 8 to which a line select signal is applied. It is preferred that the line select signal also be a 4-valued signal.

As for the method of programming the memory array 21, any one of the four row lines of memory array 21 is selected by the line select signal applied to the terminal 8. The switching element (any one of the switching elements 40–43) corresponding to the selected row line is turned on. In addition, a signal for selecting a column line is applied as the inputs x, y, z to the input terminals 1, 2, 3 to render the desired column line conductive. After these operations have been performed, a large current or voltage is impressed across the output terminal 4 and the terminal 6. Depending upon the type of arrangement, this will cause a node to be formed or to be cut open at the point where the selected row line and column line intersect. If this operation is repeated for all nodes to be formed or cut open, the memory will be programmed in its entirety, thus completing the programming procedure.

The entirety of the circuit of FIG. 2 in which each current source 11–13 is replaced by the circuit of either FIGS. 4a or 4b can be realized in the form of an integrated circuit, in which case the number of input terminals can be greatly reduced. Specifically, the input terminals 1, 2, 3, output terminal 4, voltage or current application terminal 6 for programming, mode select terminal 7, line select terminal 8, input terminal 9 for the unit current $I_0$ and the terminals for the required operating power supply $V_{DD}$ and for ground can be realized by a total of 10 pins, and it is highly advantageous if these ten pins are provided on one chip.

(3) Decoder

A specific example of the decoders 31, 32, 33, 34 shown in FIG. 2 will now be described. As these decoders are structurally identical, they will be discussed taking decoder 31 as an example.

Figure 5:
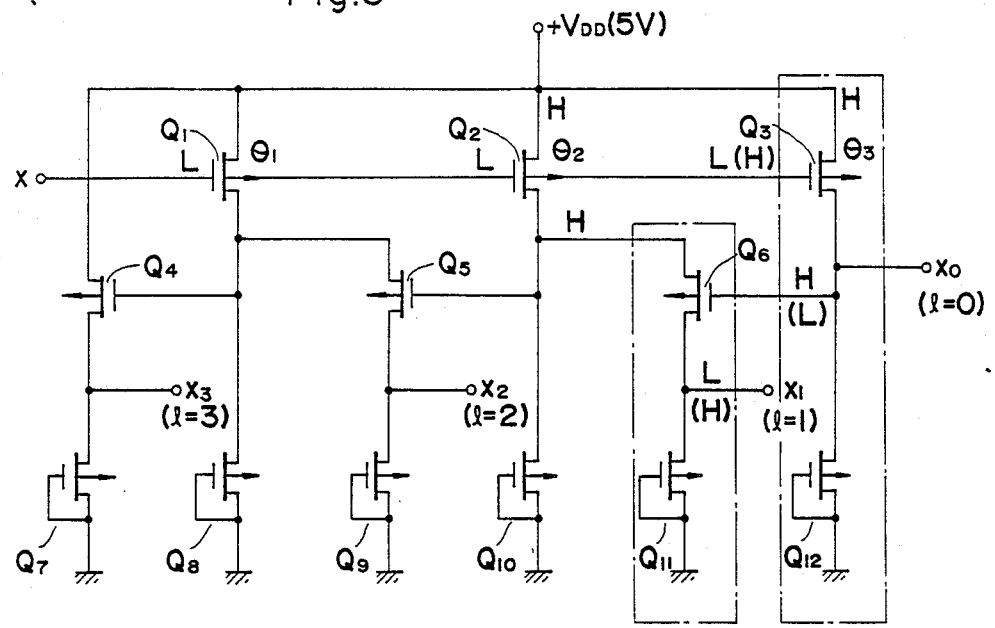
FIG. 5 is a circuit diagram depicting a decoder shown in FIG. 2 and illustrates a specific example of operation of the same in a voltage mode.

FIG. 5 illustrates an example of a decoder applied when the input x is a voltage signal. The four output terminals l=0–4 are indicated by $x_0$–$x_4$. Since the circuit of FIG. 5 is obtained by successively connecting basic circuits, the basic circuit will be described first with reference to FIG. 6.

Figure 6:
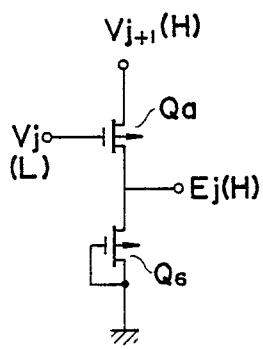
FIG. 6 illustrates a basic circuit for describing the circuit of FIG. 5.

In FIG. 6, two p-channel MOSFETs $Q_a$, $Q_b$ are connected in series. Power supply voltage, namely an H-level voltage $V_{j+1}$, is applied to the drain of the FET $Q_a$. The other FET $Q_b$ has its source connected to its gate and to ground. An output terminal is provided at the point where the two FETs $Q_a$, $Q_b$ are connected together. An output voltage $E_j$ is obtained at this output terminal. The output voltage $E_j$ of this basic circuit attains the H level only when an H-level voltage is applied to the source of the FET $Q_a$ and a L-level input voltage $V_j$ is applied to the gate of the FET $Q_a$.

Returning to FIG. 5, it is seen that the circuit is obtained by successively connecting or "cascading" six of the above-described basic circuits. The power supply voltage $V_{DD}$ (e.g. 5 V) is applied to one FET $Q_l$, $Q_2$, $Q_3$ in each of three of these basic circuits, and the FETs $Q_1$, $Q_2$, $Q_3$ are controlled by the input voltage signal x. FETs $Q_5$, $Q_6$ of the other two basic circuits are connected to the drain side of the FETs $Q_l$, $Q_2$. The power supply voltage $V_{DD}$ is applied to a FET $Q_4$ in the remaining basic circuit. Assuming that the right side of each basic circuit in FIG. 5 is the preceding stage, the gates of FETs $Q_4$, $Q_5$, $Q_6$ will be controlled by the output voltage (corresponding to $E_j$ in FIG. 6) of the respective basic circuits constituting the preceding stage.

Figure 7:
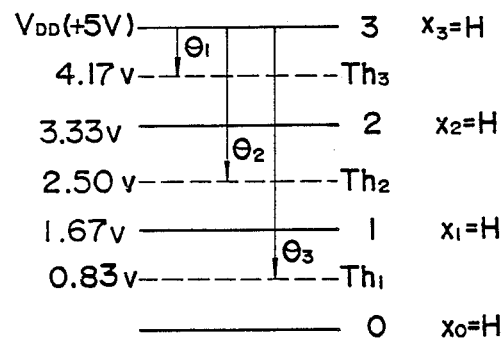
FIG. 7 is a view showing the relationship between the threshold value of drain current of a FET shown in FIG. 5 and the threshold level of the circuit.

As shown in FIG. 7, the threshold voltage values $V_{TH}$ of the drain currents of FETs $Q_1$, $Q_2$, $Q_3$ are set to mutually different values $-\theta_1$, $-\theta_2$, $-\theta_3$, respectively. For example, $\theta_1 = 0.83$ V, $\theta_2 = 2.50$ V, $\theta_3$ 32 4.17 V. $V_{DD} - \theta_3$, $V_{DD} - \theta_2$ and $V_{DD}$ 31 $\theta_1$ are threshold voltages $Th_1$, $Th_2$, $Th_3$ for subjecting the input voltage x to level discrimination. The threshold voltages $V_{TH}$ of the other FETs $Q_4$ to $Q_{12}$ should be not less 1 V.

If the input voltage x is less than the threshold voltage $Th_1$, the result is that an L-level voltage is applied to the gate of FET $Q_3$ in the basic circuit of the first stage; hence, the output voltage $x_0$ of this basic circuit attains the H level. Since the gates of the FETs $Q_6$, $Q_5$, $Q_4$ in the basic circuits for generating the other outputs $x_1$, $x_2$, $x_3$ will be at the H level, the outputs $x_1$, $x_2$, $x_3$ will be at the L level.

When the input voltage x satisfies the inequality $Th_2 > x > Th_1$, the voltage at each point changes in the manner indicated within the parentheses. That is, when the gate of FET $Q_3$ attains the H level, the output $x_0$ assumes the L level. As a result, the gate of FET $Q_6$ assumes the L level, so that the output $x_1$ attains the H level. The other outputs $x_2$, $x_3$ remain at the L level.

Thus, only the output $x_2$ attains the H level when $Th_3 > x > Th_2$ holds, and only the output $x_3$ attains the H level when $Th_3 < x$ holds.

Though the circuit of FIG. 5 is shown to be constituted by p-channel MOSFETs, it goes without saying that the decoder can be constructed in the same manner even if n-channel MOSFETs are used.

An example of a decoder for a case where the input signal x is a current will now be described. This decoder can be constructed utilizing a plurality of literal circuits which operate in the current mode. A current-mode literal circuit is described in detail in the specification of Japanese Patent Application No. 60-16897 (for which the corresponding U.S. application Ser. No. is 821,289) filed previously by the applicant. A brief discussion of this circuit now follows.

FIG. 8 illustrates an example of a one-of-four decoder utilizing four literal circuits. The input current x is inputted to a multiple-output current mirror 54, where six currents each having a value equal to that of the input current x are produced. One of these outputs is delivered to a literal circuit 50 for generating an output $x_0$, two of the outputs are delivered to a literal circuit 51 for generating an output $x_1$, two of the outputs are delivered to a literal circuit 52 for generating an output $x_2$, and the remaining output is delivered to a literal circuit 53 for generating an output $x_3$.

The operation of the literal circuit 51 for generating an output signal ab/x (a=0.5, b=1.5) will now be described. A p-channel MOSFET $Q_{S1}$ and an n-channel MOSFET $Q_{S2}$ are connected in series between a current source 59, which represents a value of $r-1$ (where r is radix), and the output terminal. Current sources 55, 56 are provided for producing currents representing the respective values a, b. The output side of the multiple-output current mirror 54 is connected to the output sides of the current sources 55, 56 at respective nodes 57, 58. The FETs $Q_{S1}$, $Q_{S2}$ are controlled by the voltages at these nodes 57, 58, respectively.

When $x > a$ holds, the potential at node 57 falls to the L level and FET $Q_{S1}$ is turned on. When $x < b$ holds, the potential at node 58 attains the H level and FET $Q_{S2}$ is turned on. Accordingly, a current $(r-1)$ is obtained at the output terminal only when $a < x < b$ holds, as shown in FIG. 9b.

Similarly, in the literal circuit 52, an output current is obtained from the output terminal if $1.5 < x < 2.5$ holds, since the settings are such that a=1.5, b=2.5.

In literal circuit 50, the components corresponding to current source 55 and FET $Q_{S1}$ are omitted. Here the setting is such that b=1.5. As a result, an output current is attained at $x < 0.5$.

In literal circuit 53, the components corresponding to current source 56 and FET $Q_{S2}$ are omitted. Here the setting is such that a=2.5. As a result, an output current is attained at $2.5 < x$.

These output currents are depicted in FIGS. 9a–9d. Thus, the circuit of FIG. 8 provides an output current at any one of its four output terminals, this depending upon the value of the input current x. The output current flows to the ground side via a resistor, as shown by the dashed lines in FIG. 8, thereby producing a voltage drop across the resistor. The corresponding switch A in the AND array 22 of FIG. 2 is controlled by this voltage drop.

If the circuit of FIG. 8 is adopted at the decoder, the value $(r-1)$ of current source 59 may be any value.

(4) Another example of an addressed switch

Figure 10:
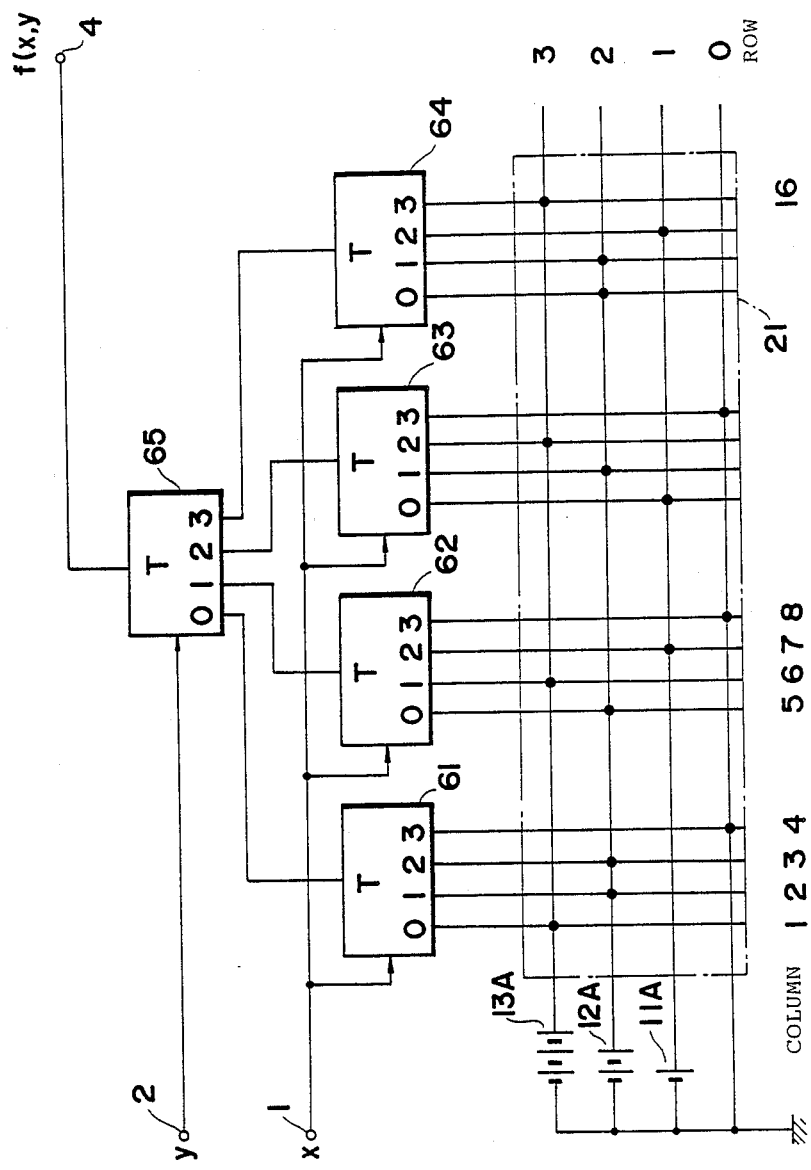
FIG. 10 is a circuit diagram illustrating another example of an addressed switch.

The addressed switch 23 in the multivalued logic function circuit of FIG. 2 can be replaced by other circuitry, e.g. several bilateral T-gates, as illustrated in FIG. 10.

For the sake of simplification, the circuit shown in FIG. 10 is illustrated for two inputs x, y. In addition, voltage sources 11A–13A are used in place of the current sources 11–13 of FIG. 2. Obviously, current sources can also be provided, in which case a current-/voltage changeover switch and a resistor would be furnished as well.

A bilateral T-gate is adapted to select a plurality of input signals by a select signal and deliver one of them as an output signal. In the arrangement of FIG. 10, the addressed switch is constituted by four bilateral T-gates 61–64 each receiving the input x as a select signal and having four input terminals, and a bilateral T-gate 65 receiving the outputs of the bilateral T-gates 61–64 as inputs and the input y as a select signal. The 1st through 4th, 5th through 8th, 9th through 12th and 13th through 16th column lines are connected to the input sides of the bilateral T-gates 61, 62, 63, 64, respectively. The output of the bilateral T-gate 65 represents the output signal f(x,y).

(5) Mask-programmable multivalued logic function circuit

In principle, the only difference between a field-programmable multivalued logic function circuit and a mask-programmable multivalued logic function circuit is in which step of a series of manufacturing steps the nodes of the memory array, indicated at numeral 21 in FIG. 2, are programmed. Accordingly, there is absolutely no difference between them as far as circuitry is concerned (though the circuits do differ in terms of IC structure). In the case of the mask-programmable multivalued logic function circuit, however, the circuit pattern is decided at the design stage. Consequently, such an arrangement is advantageous in that the circuit pattern can be simplified, though adaptability is sacrificed.

Figure 11:
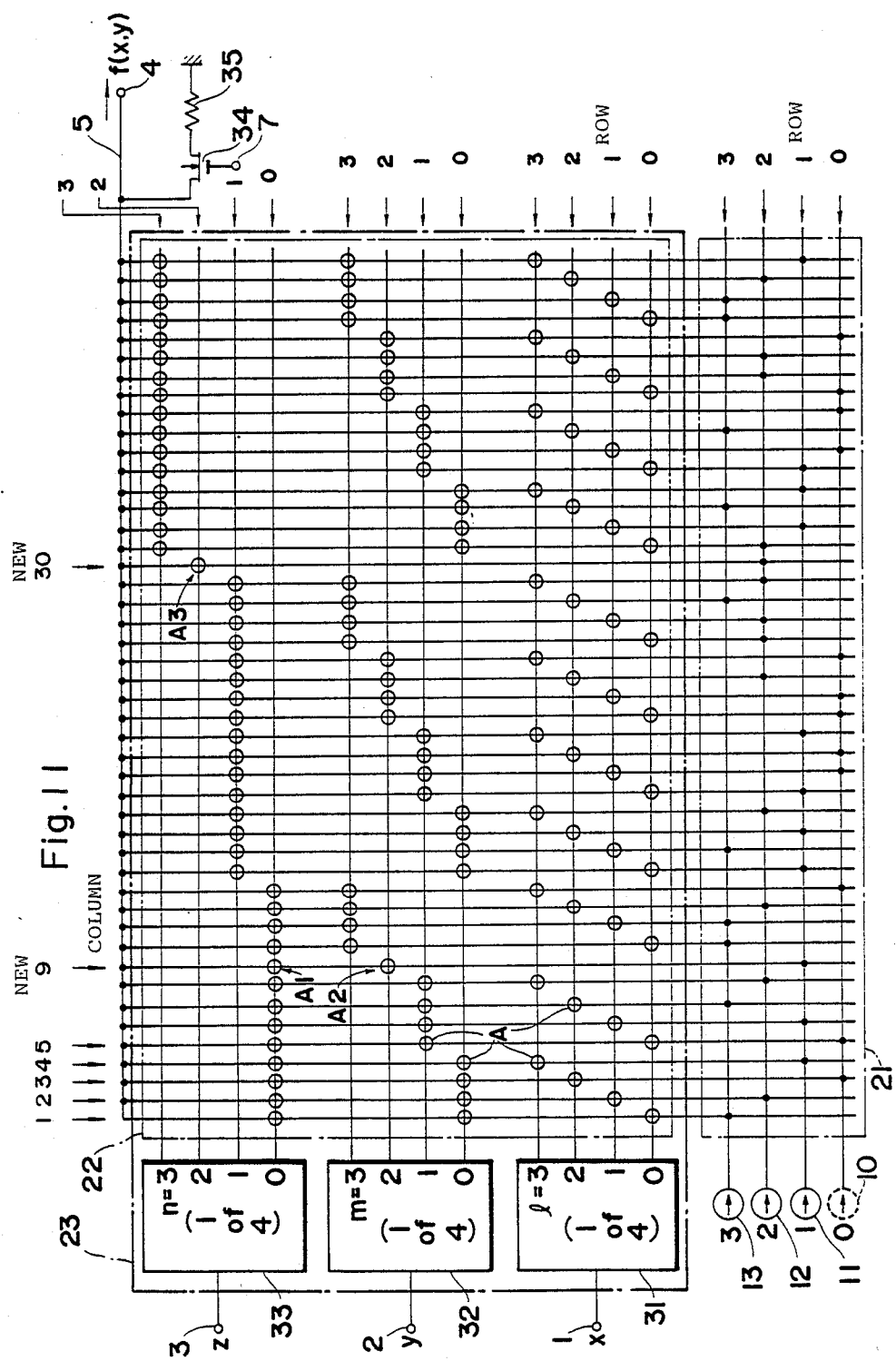
FIGS. 11 and 12 are circuit diagrams showing multivalued logic function circuits obtained through simplification of the circuit of FIG. 2 by adopting a mask programmable arrangement.

Simplification of the circuit pattern will be described upon comparing the arrangement of FIG. 2, which shows an example of the field-programmable circuit, and FIG. 11, which shows an example of a circuit which results when the arrangement of FIG. 2 is simplified by adopting the mask-programmable configuration. In FIG. 11, portions similar to those shown in FIG. 2 are designated by like reference characters. Also, the decoder 44 and the switching elements 40–43 controlled thereby are unnecessary.

It will be understood from the truth tables of FIG. 1 that f(x,y,z)=1, irrespective of the value of x, when z=0, y=2 holds. This portion is expressed as the lines of the 9th to 12columns in the circuit of FIG. 2. Since the nodes of these four column lines all lie on the 1st row line of memory array 21, it is possible to delete three of the column lines and represent the four column lines by a single column line. This new column line is indicated by a new 9th column line in FIG. 11. Since the output f(x,y,z) takes on the same value irrespective of the value of input x, the new 9th column line in the AND array 22 is not provided with a switching element controlled by the input x. The new 9th column line is provided only with switching elements $A_2$, $A_1$ controlled by the input y (=2) and the input z (=0) respectively.

Similarly, for z=2 in the truth tables of FIG. 1, f(x,y,z) =2, irrespective of the values of x, y. Accordingly, the corresponding 33rd through 48th column lines in FIG. 2 can be represented by a new 30th column line, as shown in FIG. 11. Since f(x,y,z) takes on the value 2, irrespective of the inputs x, y, when z=2 holds, the new 30th column line is provided solely with a switching element $A_3$ controlled by the input z.

Figure 12:
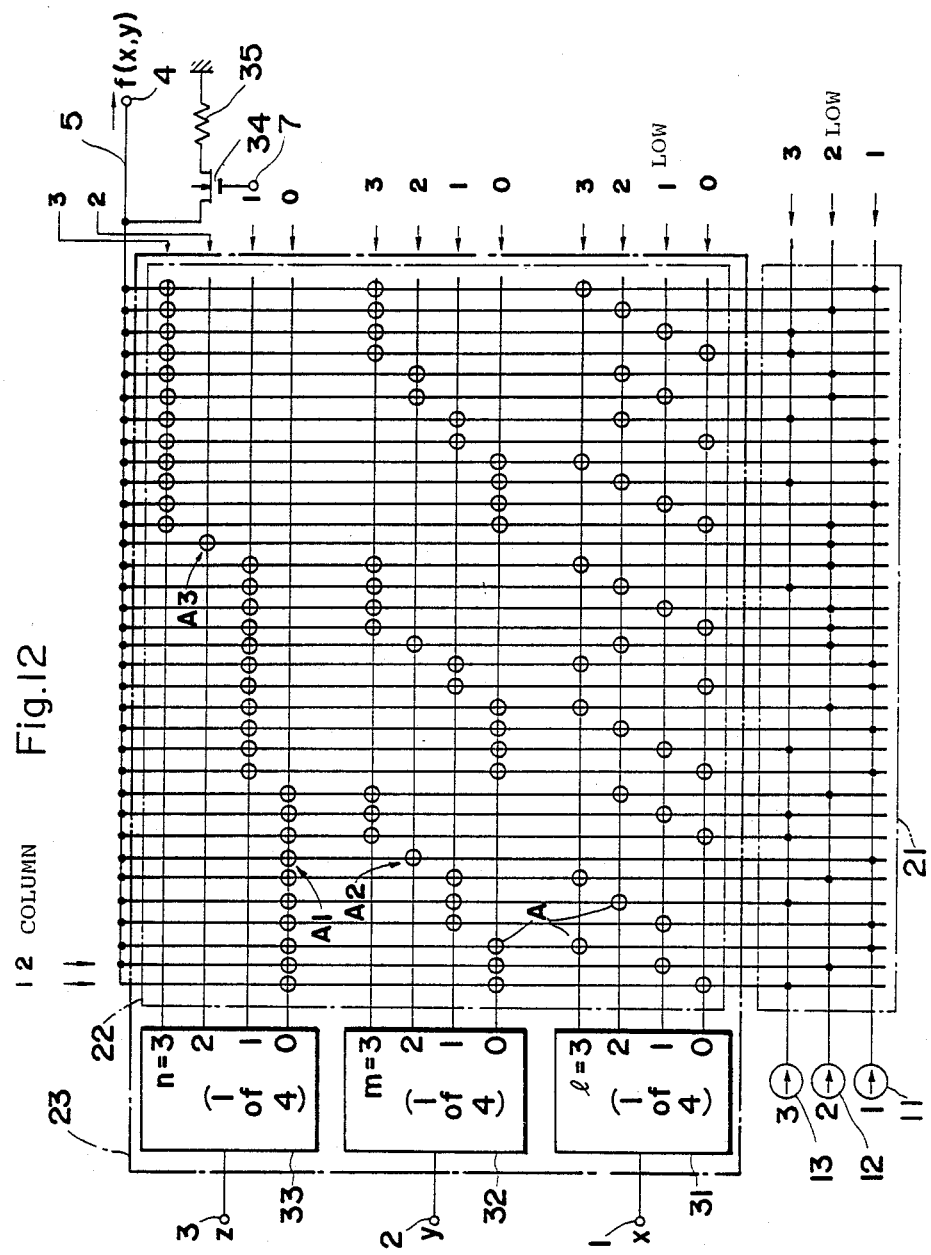

Further, as shown in FIG. 12, it is possible to delete the column line connected to the 0th line, namely the line extending from the 0 current source 10, in the memory array 21.

Thus, the multivalued logic function circuit of FIG. 2 can be greatly simplified, ultimately to the form shown in FIG. 12, if the above-described approach of deleting components is adopted.

It should be noted that the mask-programmable circuit requires programming not only of the memory array 21 but also of the AND array 22.

(6) Multiple-function circuit

Figures 13A, 13B:
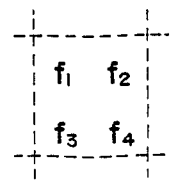
FIG. 13a is a view showing an example of a multiple-function truth table.
FIG. 13b is a view showing the correlation between four functions and truth table values.

A multiple-function circuit is one which generates a plurality of function outputs for a certain combination of inputs. FIGS. 13a, 13b show an example of a 2-input 4-valued multiple-function truth table, and FIG. 14 illustrates an sample of a multiple-function circuit for executing the functions of the truth table.

In FIG. 13a, four function values are illustrated in the form of a matrix for combinations of input variables x and y. These function values indicate values of functions $f_1$, $f_2$, $f_3$ and $f_4$ shown in FIG. 13b.

Figure 14:
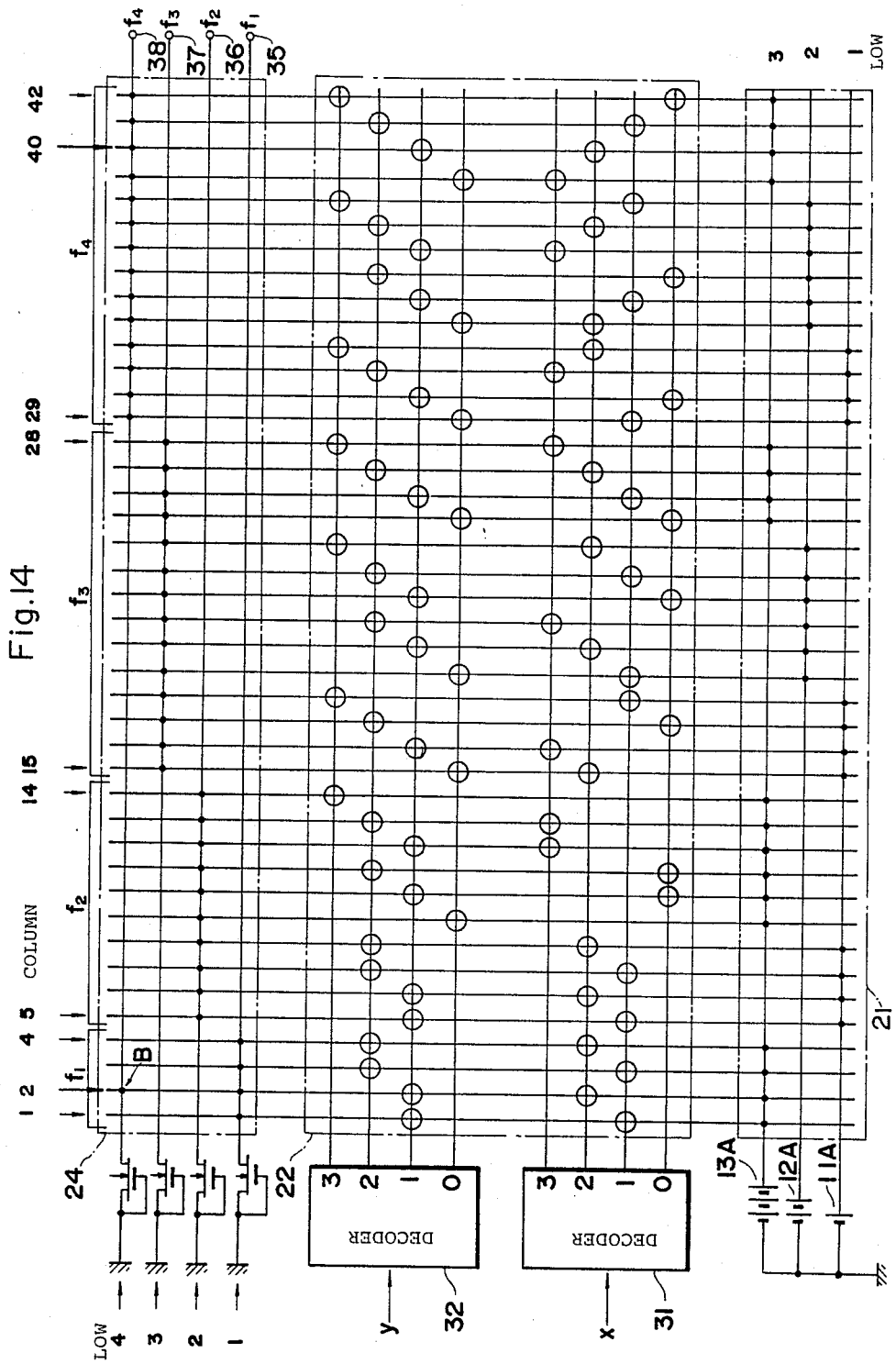
FIG. 14 is a circuit diagram showing an example of a multiple-function circuit for realizing the truth table of FIG. 13.

In FIG. 14, there are provided four row lines (output lines) connected to output terminals 35–38 for outputting the four functions $f_1$–$f_4$. The row lines intersect the column lines from the memory array 21. The output line of the first row corresponding to function $f_1$ is connected to the 1st through 4th column lines, the output line of the second row corresponding to function $f_2$ is connected to the 5th through 14th column lines, the output line of the third row corresponding to function $f_3$ is connected to the 15th through 28th column lines, and the output line of the fourth row corresponding to function $f_4$ is connected to the 29th through 42nd column lines. Nodes are formed at the points where these connections are made. These four row lines and nodes construct a sum array 24.

The four column lines connected to the output row line corresponding to function $f_1$ in the sum array 24 have switching elements controlled by the outputs of the decoders 31, 32 in the AND array 22, and nodes with the three row lines extending from the voltage signal sources 11A–13A in the memory array 21. These switching elements and nodes are programed in advance in the manner described earlier.

The above also holds for the column lines which generate the other functions $f_2$–$f_4$.

It will be understood that when a certain combination of inputs x and y is applied to the circuit shown in FIG. 14, there will be obtained signals representing the four different functions $f_1$–$f_4$ indicating the results of operating on the inputs x, y in accordance with the truth table of FIG. 13a. With a multiple-function circuit of this type, it is required that the sum array 24 be programmed in advance in addition to the memory array 21 and AND array 22.

It is possible to reduce the number of column lines in the circuit of FIG. 14. For example, the 2nd column line and 40th column line are both for generating output signals of value 3 when x=2, y=1, and these signals appear at output terminals 35, 38, respectively. Accordingly, if the 2nd column line and 4th row line, which is connected to the output terminal 38, are connected together at the node indicated by B, output signals exactly the same as those mentioned above will be obtained at the output terminals 35, 38 even if the 40th column line is eliminated. Thus, for these column lines that generate function outputs of the same value for the same combination of inputs between different functions, it is possible to leave just one line and delete the other.

(7) Multivalued ALU

Figure 15:
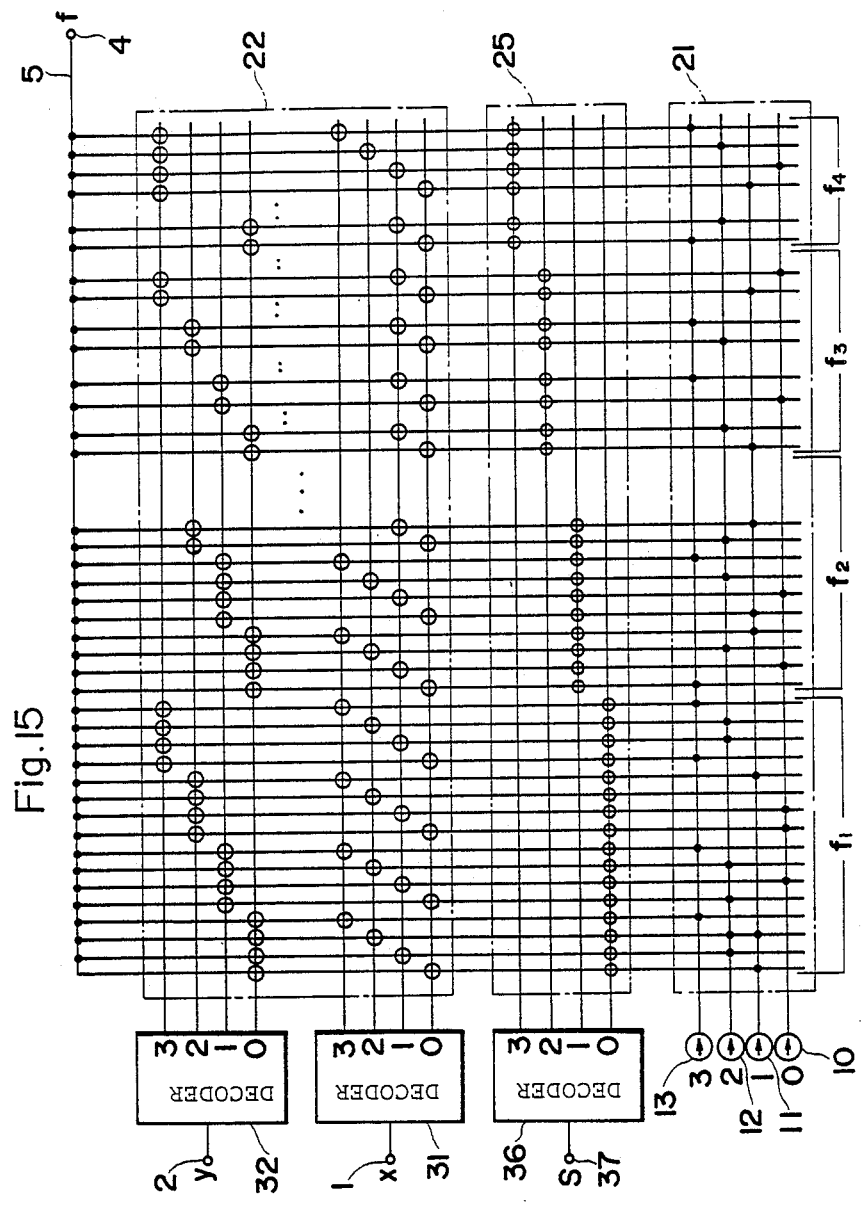
FIG. 15 is a circuit diagram of a 4-value 2-input ALU, which illustrates one example of a multivalued ALU.

FIG. 15 depicts a field-programmable 4-valued 2-input ALU constructed by utilizing the above-described memory array and addressed switch (the decoders and AND array). Portions identical with those described so far are designated by like reference characters.

This ALU has two input signals, namely x and y, and is capable of performing four different arithmetic operations. The operations or the results thereof are indicated by $f_1$, $F_2$, $f_3$, $f_4$. Since performing an operation is the same as finding the value of the function representing the operation, the aforementioned $f_1$–$f_4$ shall be referred to as functions in the following description when appropriate.

In the arrangement of FIG. 15, the memory array 21 is programmed to have truth tables of the four different functions $f_1$–$f_4$. An AND array portion is provided with respect to the inputs x and y, just as illustrated in FIG. 2, for the memory array portion of each function. The aggregate of these AND array portions constructs the AND array 22. All column lines of the AND array 22 are connected to the single output line 5.

A select terminal 37 is provided in order to select the aforementioned four operations or functions and has a 4-value select signal applied thereto. The select terminal 37 is connected to the input side of the 1-of-4 decoder 36, from which four control lines emerge. Any one of the control lines designated by the inputted 4-valued select signal attains the H level.

Each column line is provided with a single switching element between the AND array 22 and memory array 21. These switching elements are controlled by the control lines of decoder 36 that designate the corresponding function and construct a selection array 25. The latter, it should be noted, can be provided between the AND array 22 and output terminal 5 rather than in the position shown in FIG. 15.

Thus, the inputs x, y and the select signal S are applied to the ALU of FIG. 15. The arithmetic operation selected by the select signal S is executed for the inputs x, y, and the results of the operation are obtained at the output terminal 4 via the output line 5.

It is possible to adopt an arrangement in which the ALU is switched between the current and voltage modes of operation, as shown in FIG. 2, and the ALU can be equipped with the decoder 40 and switching elements 40–43 for programming. The ALU can also be converted into an ALU of the mask-progammable type. In accordance with the present invention, the ALU can easily be expanded to handle three or more inputs and multiple values other than four.

Figure 16:
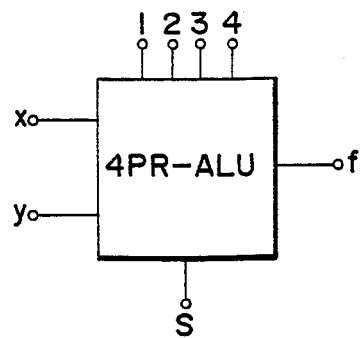
FIG. 16 is a block diagram illustrating the multivalued ALU of FIG. 15 constructed on a single chip by IC techniques.

It is possible for the multivalued ALU of FIG. 15 to be fabricated on a single chip by adopting an integrating technique, in which case the chip would appear as shown in FIG. 16. The minimum number of pins necessary is ten, namely input pins for the x and y inputs, an input pin for the select signal S, an output pin for the operational result f, current input pins for inputting currents indicative of the four logic values 0 through 3, a pin for applying the operating voltage, and a pin for the ground terminal. If necessary, a pin for the programming terminal 6 and a pin for the current/voltage mode changeover signal input terminal 7 (both shown in FIG. 2) can be added.

Figure 17:
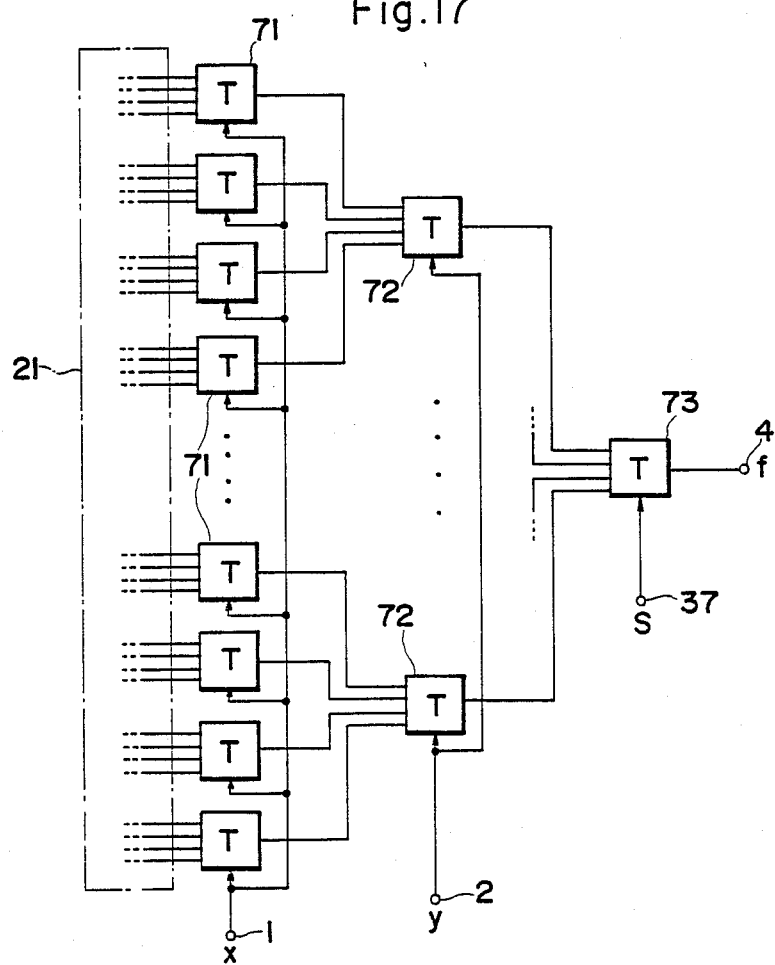
FIG. 17 is a circuit diagram illustrating an example of a multivalued ALU constituted by a memory array and bilateral T-gates.

FIG. 17 illustrates an example in which the addressed switch and selection array of the multivalued ALU shown in FIG. 15 are realized by bilateral T-gates. Sixteen bilateral T-gates 71 controlled by the input x are provided, each having four different column lines of memory array 21 connected to its input side. Four bilateral T-gates 72 controlled by the y input are also provided, each having the output lines of four different bilateral T-gates 71 connected to its input side. The output lines of the bilateral T-gates 72 are connected to the input side of a bilateral T-gate 73 controlled by the selection signal S. The bilateral T-gate 73 has an output line connected to the output terminal 4. Thus, it is possible to construct a multivalued ALU by using bilateral T-gates.

Figure 18:
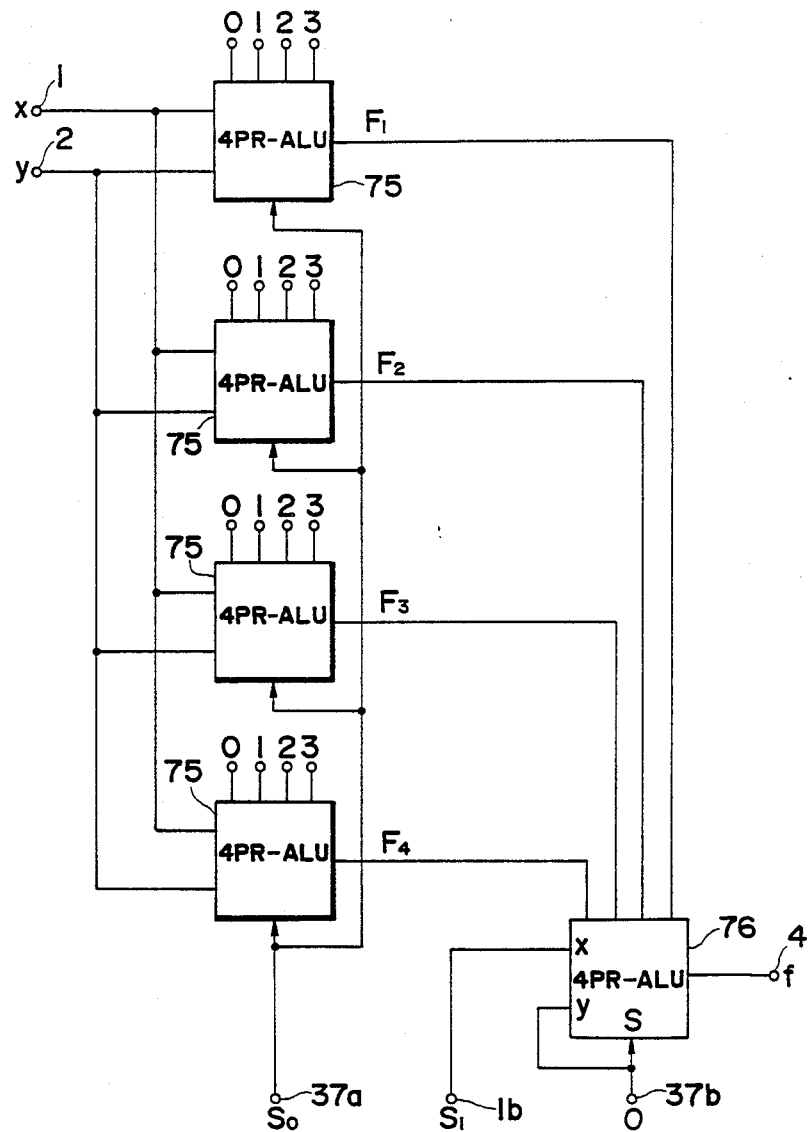
FIG. 18 is a block diagram in which a multivalued ALU capable of implementing 16 functions is realized by using five ALU chips.

FIG. 18 depicts an example of a 4-valued 2-input ALU for 16 functions constructed by using five of the single-chip ALUs for four functions illustrated in FIG. 16.

In FIG. 18, four 4-function single-chip ALUs 75 are connected in parallel and are programmed in advance to have a total of 16 different functions. The inputs x, y are applied to the respective input terminals 1, 2 of these ALUs, and currents representing the logic values of 0–3 are applied to current source terminals.

The 16 functions can be selected by a 4-valued 2-digit signal $S_1 S_0$. The lower order digit (i.e. a digit having a lower significance) $S_0$ of the select signal $S_1 S_0$ is applied to the selection terminal (designated by numeral 37a in FIG. 18) of each ALU 75. As a result, the four ALUs 75 output four functions $F_1$–$F_4$ selected by the signal $S_0$. Any one of these functions $F_1$–$F_4$ is selected by an additional single ALU 76 to which the signal $S_1$ of the higher order digit (i.e. a digit having a higher significance) is applied. The ALU 76 is one type of bilateral T-gate and a bilateral T-gate can of course be used in place of the ALU 76.

Figure 19:
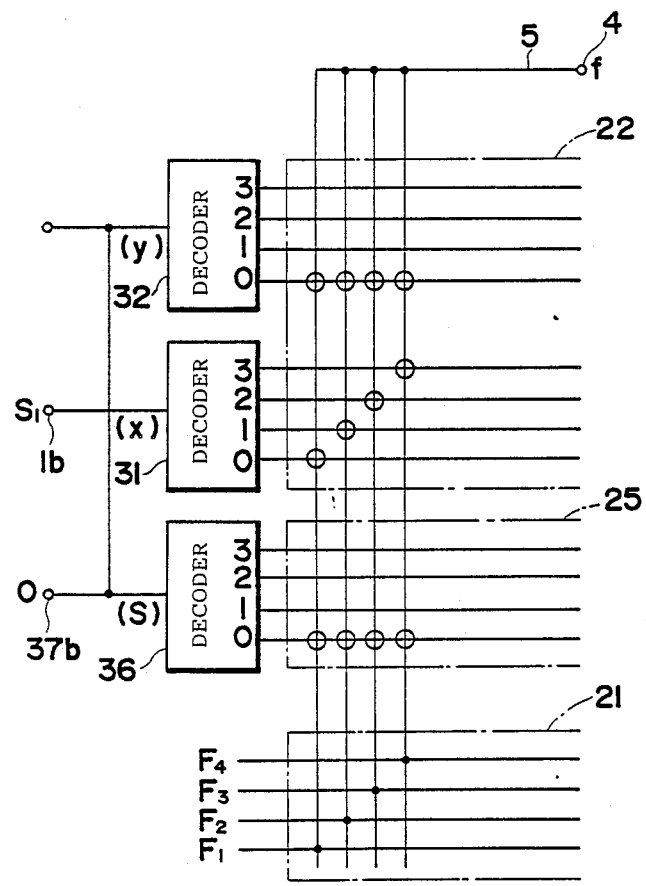
FIG. 19 is a circuit diagram illustrating the detailed wiring of an ALU used as a bilateral T-gate in the circuit of FIG. 18.

FIG. 19 illustrates the specific connections of the ALU 76 acting as a bilateral T-gate which selects one of four inputs. Rather than currents representing logic values, currents indicative of the functions $F_1$–$F_4$ outputted by the abovementioned ALUs 75 are inputted to respective ones of the row lines of memory array 21. Only the 1st through 4th column lines controlled by the control line connected to the output 0 terminal of decoder 32 and the control line connected to the output 0 terminal of decoder 36 are programmed so as to have a node with one each of the four row lines in memory array 21. Further, the input sides of the decoders 32, 36 are connected together and to a terminal 37b to which a signal of logic value 0 is applied. Accordingly, an H-level control signal appears at the 0 output terminals of decoders 32, 36 to turn on switching elements corresponding to the 1st through 4th column lines. The select signal $S_1$ of the higher order digit is applied to the decoder 31 and selects any one of the 1st through 4th column lines. As a result, any one of the functions $F_1$–$F_4$ inputted to the memory array 21 is delivered to the output terminal 4.

An ALU capable of implementing 16 different functions is thus realized. Thus, almost all functions currently defined can be covered.

Several concrete examples of multivalued function circuits will now be discussed.

(8) Multivalued MAX/MIN function circuit

A multivalued MAX function and multivalued MIN function are expressed by the aforementioned Eqs. (1) and (2), respectively. A multivalued 2-variable MAX operation involves selecting whichever of the variables x, y has the larger value and adopting the larger value as the result of the operation. A multivalued 2-variable MIN operation involves selecting whichever of the variables x, y has the lesser value and adopting the lesser value as the result of the operation.

Figure 20:
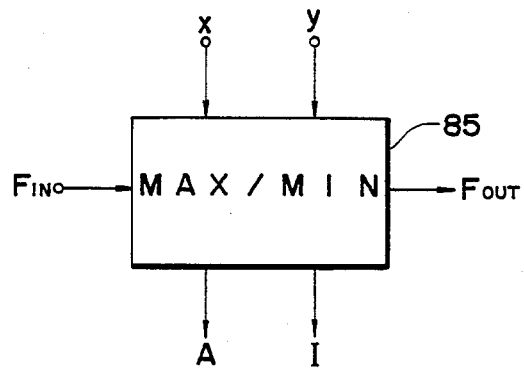
FIG. 20 is a view showing the relationship between the inputs and outputs of a multivalued MAX/MIN function circuit block.

FIG. 20 depicts a circuit for performing both the MAX and MIN operations. The circuit, denoted by reference numeral 85, has two input terminals for signals representing the variables x and y, an input terminal for a flag input Fin, an output terminal for the result A of the MAX operation, an output terminal for the result I of the MIN operation, and an output terminal for a flag output Fout. The flag output Fout is indicative of the size relationship of the inputs x and y; Fout=0, 1, 2 when x=y, x<y, x>y, respectively. The input terminal for the flag input Fin is for introducing the flag output Fout of a preceding circuit stage to the flag input of the next circuit stage in a case where MAX/MIN function circuits of this type are cascade-connected.

The MAX/MIN circuit shown in FIG. 20 can be realized by modifying the multiple-function circuit of FIG. 14 into a 3-input circuit. It can also be realized as a portion of the multivalued ALU shown in FIG. 15. In the latter case, it would be possible to select either the MAX output A or MIN output I by the select signal S.

Figure 21:
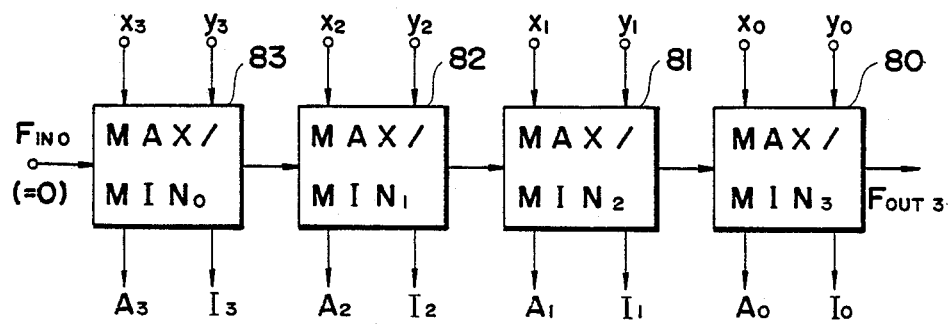
FIG. 21 is a block diagram of a plural-digit MAX/MIN circuit constructed by cascade-connecting MAX/MIN circuits.

As shown in FIG. 21, a plurality of MAX/MIN circuits 80–83 are cascade-connected by connecting the flag output of one stage to the flag input of the next. This makes it possible to perform MAX and MIN operations involving plural-digit multivalued variables $(x_3 x_2 x_1 x_0)$ and $(y_3 y_2 y_1 y_0)$. The initial flag input $Fin_0$ is 0. The last flag output $Fout_3$ indicates which of the abovementioned 4-digit multivalued variables is larger.

The truth tables of these MAX/MIN multivalued functions for a case where four values are involved are as shown in FIG. 22.

For Fin=0, the output A or I indicates which of the inputs x, y is larger or which is lesser.

For Fin=1 (i.e. y>x)k, the output A represents the value of the input y as such and the output I represents the value of input x as such. Further, Fout=1.

For Fin=2 (x>y), the output A is equal to x and the output I is equal to y. Fout=2.

Figure 23:
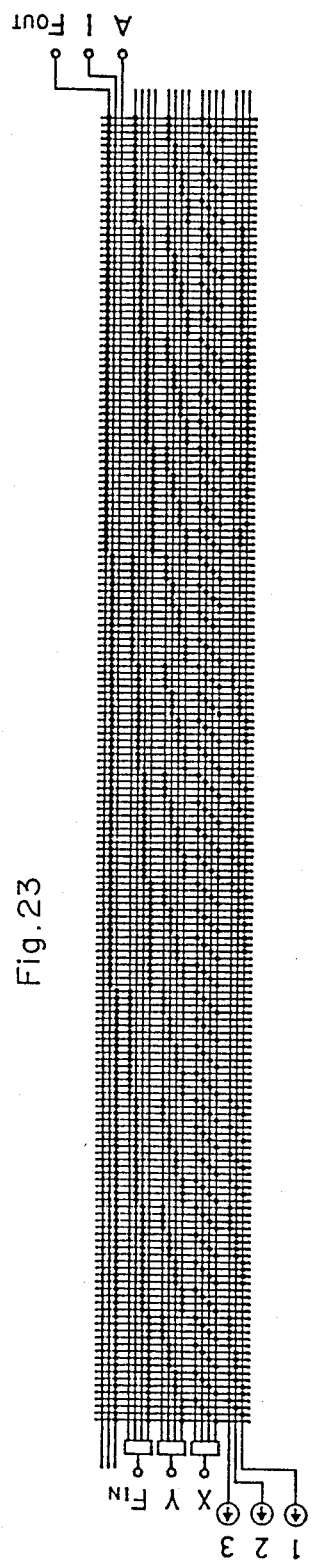
FIG. 23 is a connection diagram of a 4-valued MAX/MIN function circuit.

FIG. 23 is a connection diagram of a 4-valued MAX/MIN function circuit constructed using the truth tables of FIG. 22. Though nodes and switching elements are both indicated by the black circles in the diagram, the general features of this arrangement will be readily understood by comparing it with the multifunction circuit of FIG. 14. This arrangement is slightly different from that of FIG. 14 in that there are three inputs, namely x, y and Fin; there are three outputs, namely A, I and Fout; and current sources are used as the signal sources, the direction of these current being opposite of those shown in FIG. 2.

Figure 24:
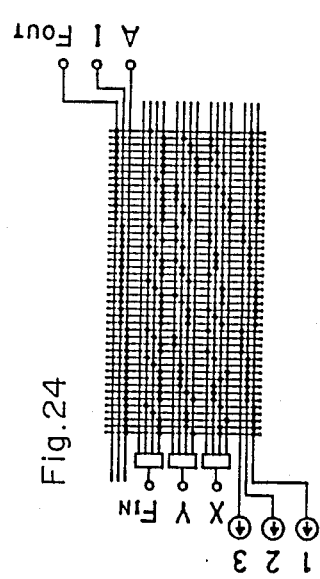
FIG. 24 is a connection diagram for a case where the circuit of FIG. 23 is simplified.

FIG. 24 shows a simplification of the circuit depicted in FIG. 23. This is a mask-programmable type circuit mentioned above.

(9) Multivalued full adder circuit

Figure 25:
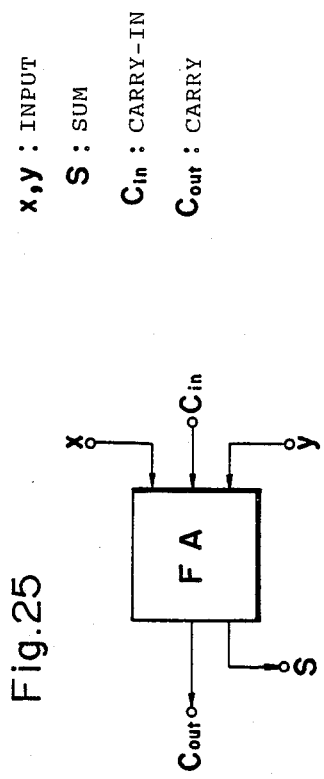
FIG. 25 illustrates the relationship between the inputs and outputs of a multivalued full adder circuit.

FIG. 25 illustrates a block of a full adder circuit FA, the relationship between the input and output thereof, and an arithmetic formula expressing full addition. The inputs to the circuit are the variables x, y and a carry-in Cin from the lower order digit. The outputs are the sum S and a carry Cout to the higher order digit.

Figure 26:
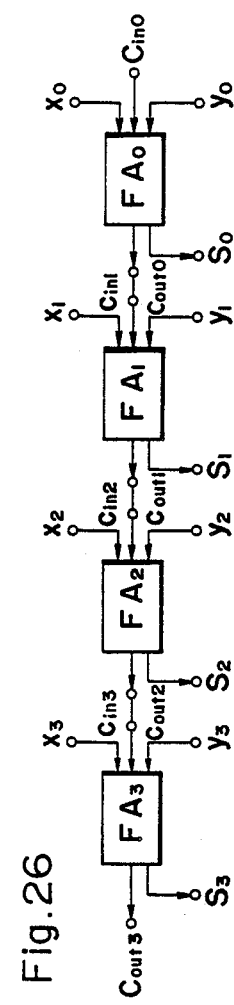
FIG. 26 is a block diagram of a full adder circuit for a plurality of digits and is constructed by cascade-connecting full adder circuits.

FIG. 26 depicts a circuit for adding 4-digit variables $(x_3x_2x_1x_0)$ and $(y_3y_2y_1y_0)$, as well as an arithmetic formula representing this addition. Four circuits $FA_0$, $FA_1$, $FA_2$, $FA_3$ equivalent to the full adder circuit block of FIG. 25 are serially connected in such a manner that Cout of the lower order digit block is connected to Cin of the higher order digit block.

FIG. 27 is a view showing truth tables of the 4-valued full adder circuit.

Figure 28:
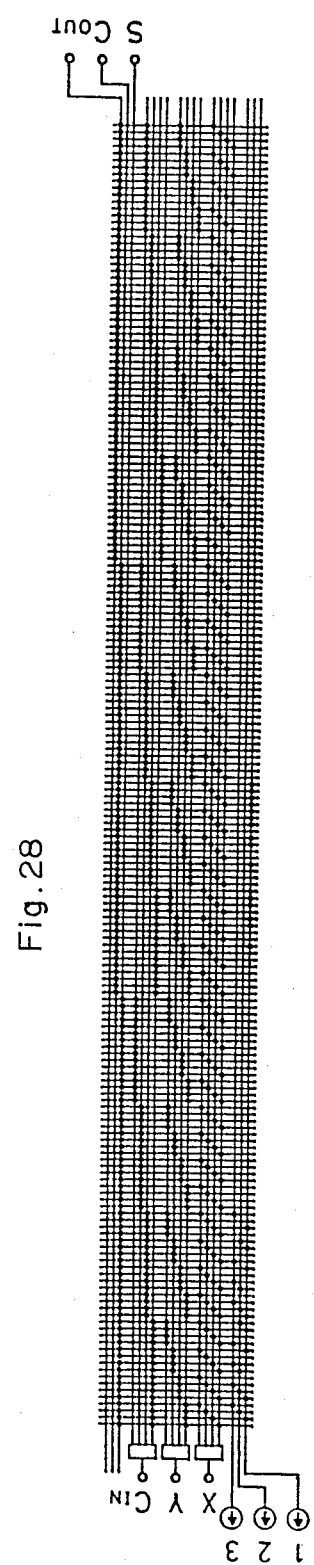
FIG. 28 is a connection diagram of a 4-valued full adder circuit.

FIG. 28 is a detailed connection diagram of a full adder circuit programmed on the basis of these truth tables For four values, the carry-in Cin takes on only two values, namely 0 and 1. Accordingly, two of the four column lines connected to the output side of the decoder for Cin in the AND array of FIG. 28 are meaningless. In addition, since only two outputs exist, namely S and Cout, the remaining output line of the three output lines is unnecessary in actual practice.

Figure 29:
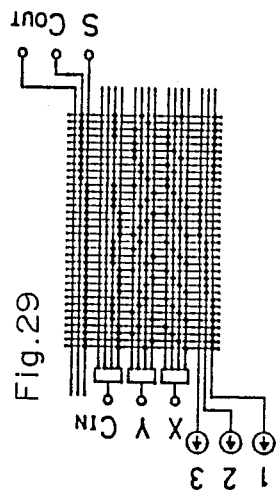
FIG. 29 is an connection diagram showing a simplification of the circuit of FIG. 28.

FIG. 29 illustrates a simplification of the connection diagram of FIG. 28.

(10) Multivalued full subtracter circuit

Figure 30:
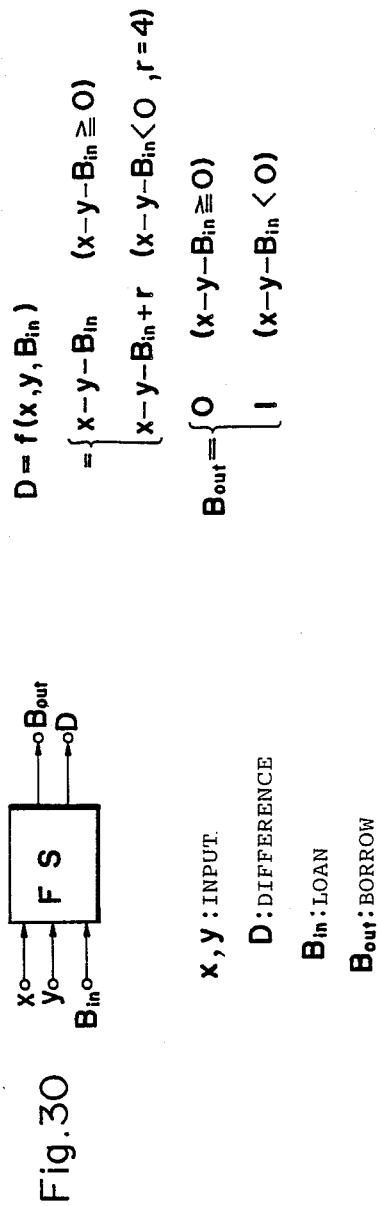
FIG. 30 illustrates the relationship between the inputs and outputs of a multivalued full subtracter circuit block of a first type.

FIG. 30 illustrates the relationship between the inputs and outputs of a full subtracter circuit FS of a first type, as well as an arithmetic formula of full subtraction. The inputs to the circuit are the variables x, y and a loan Bin to a lower order digit. The outputs are the difference D and a borrow Bout to a higher order digit. Bin and Bout take on a value of 0 or 1. The circuit is effective only when x>y holds. FIG. 32 illustrates the truth tables of full subtraction for a case r=4, i.e. for a case where there are four values.

Figure 31:
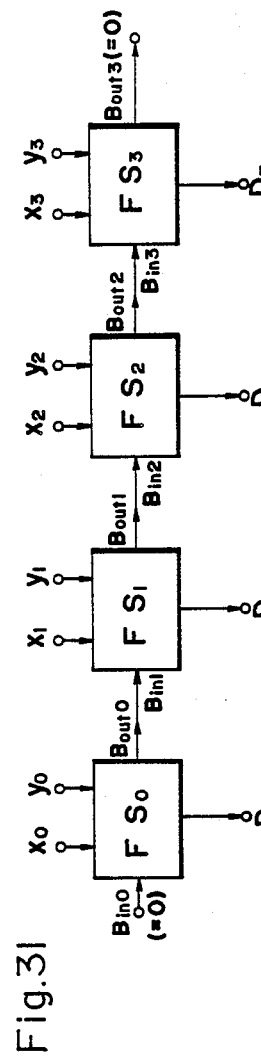
FIG. 31 is a block diagram showing a full substracter circuit for a plurality of digits and is constructed by cascade-connecting the full subtracter circuits of the first type.

FIG. 31 shows a circuit constructed by serially connecting four full subtracter circuits $FS_0$, $FS_1$, $FS_2$, $FS_3$, each of which has a function the same as that of the full subtracter circuit of FIG. 30, in such a manner that Bout of the lower order digit is connected to Bin of the higher order digit. This arrangement is capable of subtracting a 4-digit variable $(y_3 y_2y_1y_0)$ from a $\propto$-digit variable $(x_3x_2x_1x_0)$. The foregoing holds with the proviso $(x_3x_2x_1x_0) > (y_3y_2y_1y_0)$.

Figure 33:
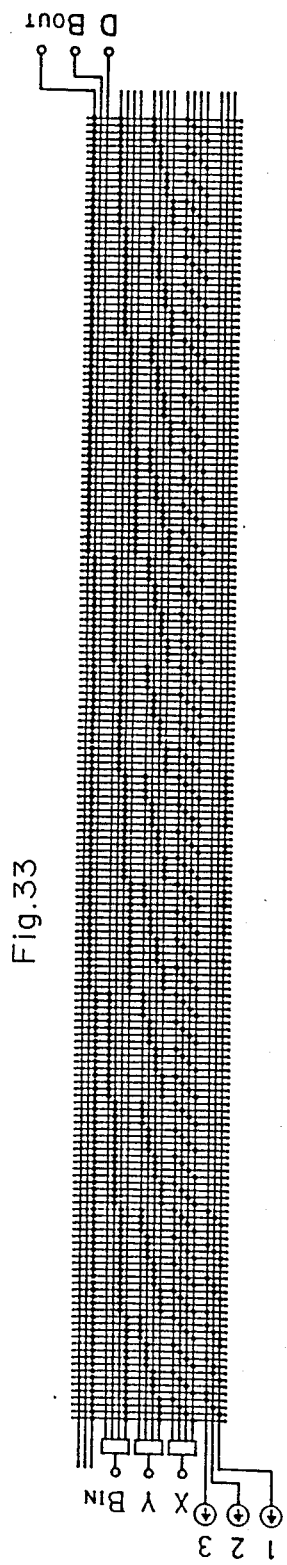
FIG. 33 is a connection diagram showing a 4-valued full subtracter circuit of the first type.
Figure 34:
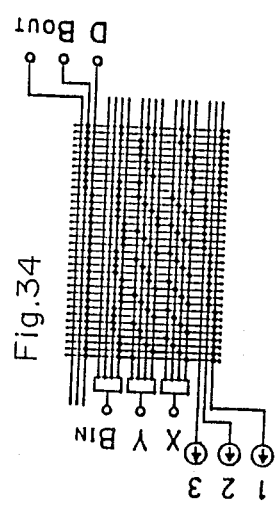
FIG. 34 is a connection diagram showing a simplification of the circuit of FIG. 33.
Figure 35:
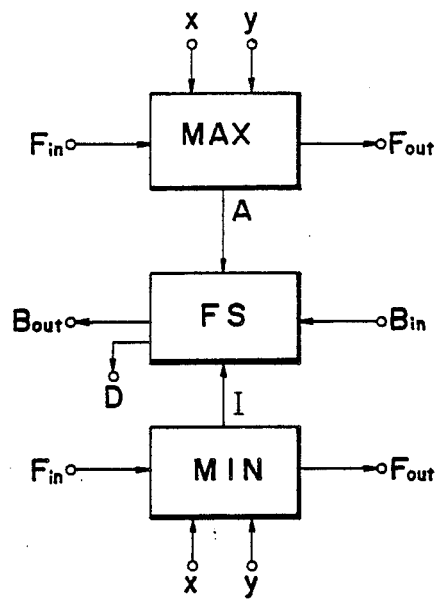
FIG. 35 is a view illustrating a special subtracter circuit.

FIG. 33 is a detailed connection diagram showing a 4-valued full subtracter circuit, and FIG. 34 is a connection diagram showing a simplification of the circuit of FIG. 33. FIG. 35 shows a special subtracter circuit. If the flag input Fin and loan Bin are not taken into consideration, the larger of the inputs x, y is selected by the MAX circuit, the lesser is selected by the MIN circuit, the selected values are inputted to the full subtracter circuit FS, and a difference output D=x-y (x≧y) or D=y-x (y≧x) is obtained. This is an absolute difference. If Fin, Bin are taken into consideration, the circuit becomes highly specialized.

Figure 36:
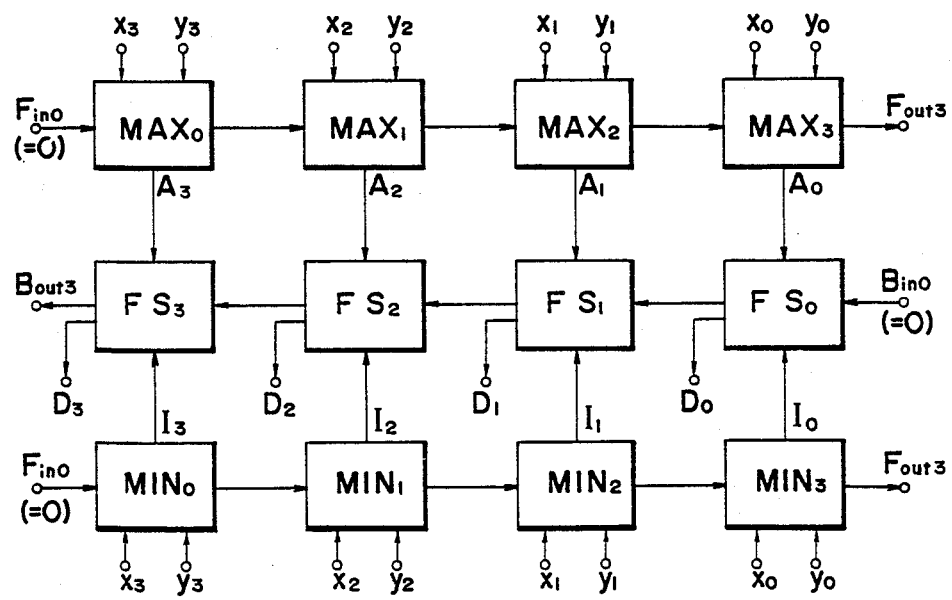
FIG. 36 is a block diagram of a circuit obtained by connecting the circuit of FIG. 35 in a 4-digit cascade.

FIG. 36 shows a circuit obtained by connecting the circuit of FIG. 35 in a four-digit cascade.

Figure 37:
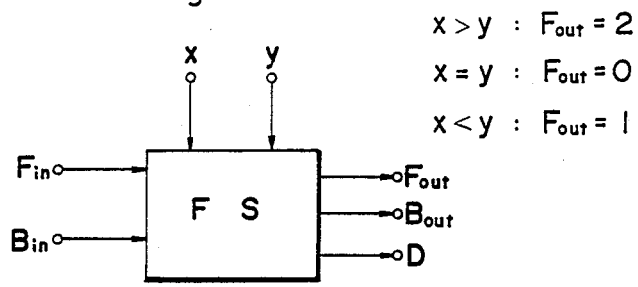
FIG. 37 is a view illustrating the relationship between the inputs and outputs of a full subtracter circuit block of a second type.

FIG. 37 is a view illustrating the relationship between the inputs and outputs of a multivalued full subtracter circuit of a second type. The circuit can be applied in a case where either the input x or y is the larger and is capable of outputting either a +or −sign representing the results of a magnitude comparison. The sign is represented by a flag F (Fin, Fout). The flag takes on the value 2 when x>y holds, the value 0 when x=y holds, and the value 1 when x<y holds. The flag input Fin is an input from a lower order digit, and the flag output Fout is an output to a higher order digit The other input and output are the same as those depicted in FIG. 30.

FIG. 39 illustrates the truth tables of the above-described full subtracter circuit in a case where there are four values.

Figure 38:
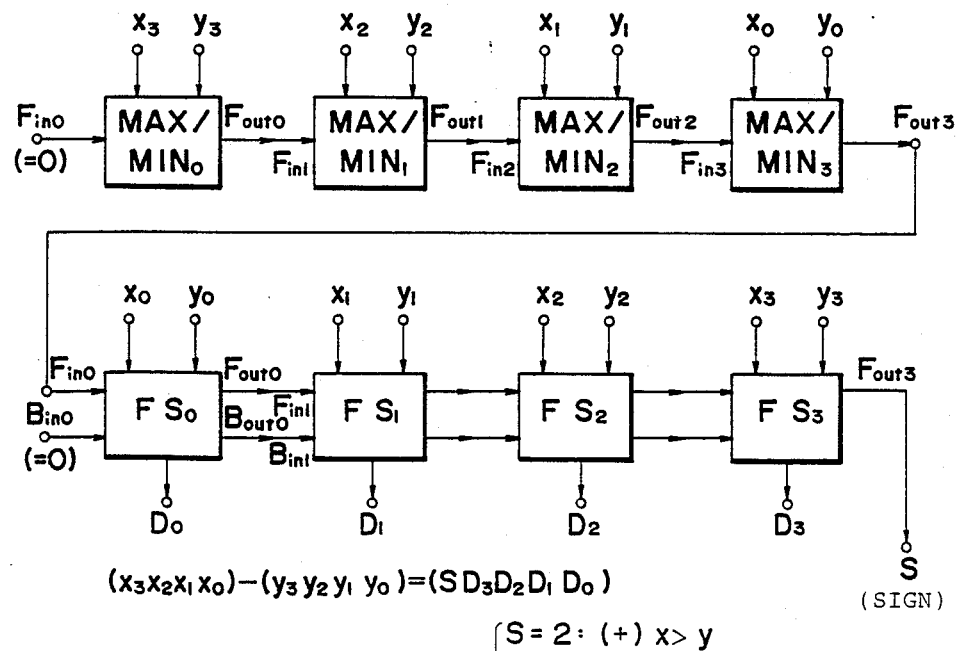
FIG. 38 is a block diagram of a full subtracter circuit for a plurality of digits and is constructed by cascade-connecting full subtracter circuits of the second type.

FIG. 38 depicts a subtracter circuit which performs a 4digit subtraction $(x_3x_2x_1x_0) − (y_3y_2y_1y_0)$ using the full subtracter circuit shown in FIG. 37. A determination is made as to which of $(x_3x_2x_1x_0)$, $(y_3y_2y_1y_0)$ is larger or smaller, or as to whether they are the same, by the MAX/MIN circuits for four digits shown in FIG. 21, and the results of the determination are represented by the flag output $Fout_3$ of the circuit $MAX/MIN_3$. The four full subtracter circuits $FS_0$–$FS_3$ are cascade-connected by connecting the lower order digit Fout with the upper order digit Fin and the lower order digit Bout with the higher order digit Bin. $Fout_3$ of the circuit $MAX/MIN_3$ is inputted to the full subtracter circuit $FS_0$ of the least significant digit as $Fin_0$. $Fout_3$ of circuit $FS_3$ of the most significant digit represents the sign S of the results of the final subtraction operation.

(11) Multivalued full multiplier circuit

Figure 40:
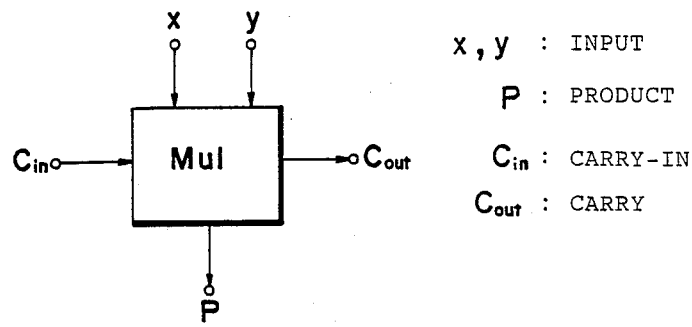
FIG. 40 illustrates the relationship between the inputs and outputs of a multivalued full multiplier circuit block.

The inputs and outputs of a multivalued full multiplier circuit are shown in FIG. 40. The inputs are the two variables x, y and a carry-in Cin from a lower order digit. The outputs are the product P and a carry Cout to a higher order digit.

FIG. 42 shows the truth tables of a full multiplier circuit in a case where there are four values.

Figure 43:
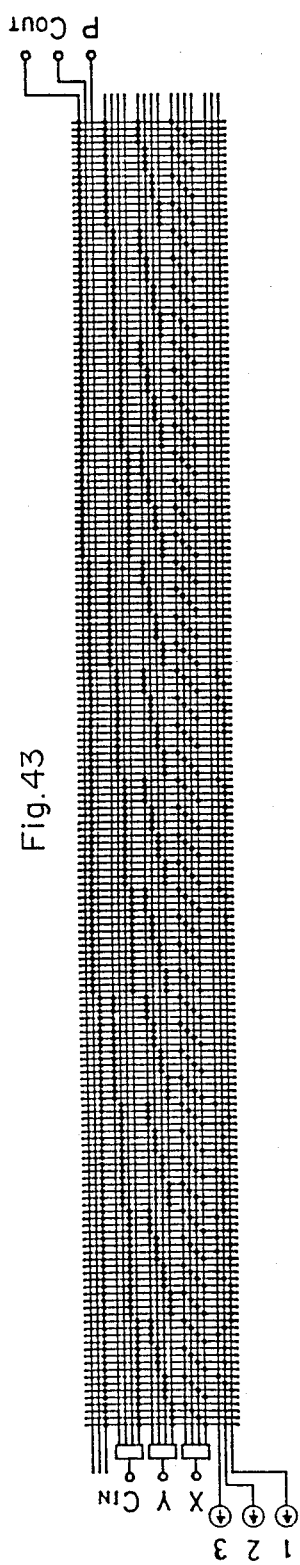
FIG. 43 is a connection diagram of a 4-valued full multiplier circuit.
Figure 44:
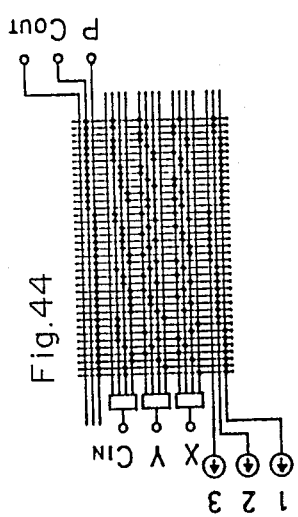
FIG. 44 is a connection diagram showing a simplification of the circuit of FIG. 43.

FIG. 43 illustrates the details of the connections programmed using these truth tables, and a simplified version of this circuit is depicted in FIG. 44.

Figure 41:
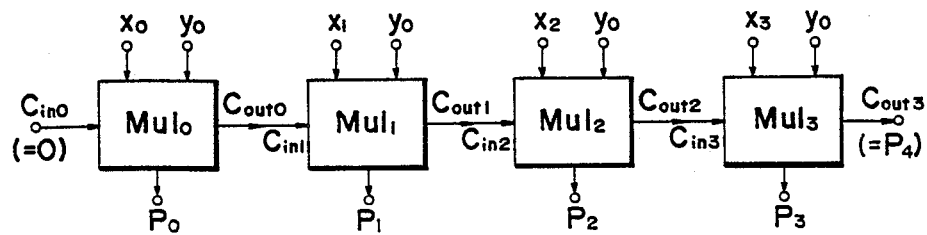
FIG. 41 is a block diagram illustrating an example in which a multiplier circuit for 4-digit and 1-digit variables is constructed by cascade-connecting full multiplier circuits.

FIG. 41 illustrates an example of a 4-digit ×1-digit full multiplier circuit constructed using four of the abovementioned multiplier circuits. The circuit is formed by cascade-connecting 1-digit full multiplier circuits $Mul_0$–$Mul_3$ in such a manner that Cout of the lower order digit is connected to Cin of the higher order digit. Since the operation $(x_3x_2x_1x_0)$ $y_0$ is performed, the inputs to the circuits $Mul_0$–$Mul_3$ are $x_0,y_0$; $x_1,y_0$; $x_1,y_0$; $x_2,y_0$; $x_3,y_0$; respectively. The results of the multiplication operation are represented by $(Cout_3P_3P_2P_1P_0)$, using the products $P_0$–$P_3$ of the multiplier circuits $Mul_0$–$Mul_3$ and the carry $Cout_3$ of circuit $Mul_3$. $Cout_3$ may be replaced by $P_4$ in the results of the multiplication.

Figure 45:
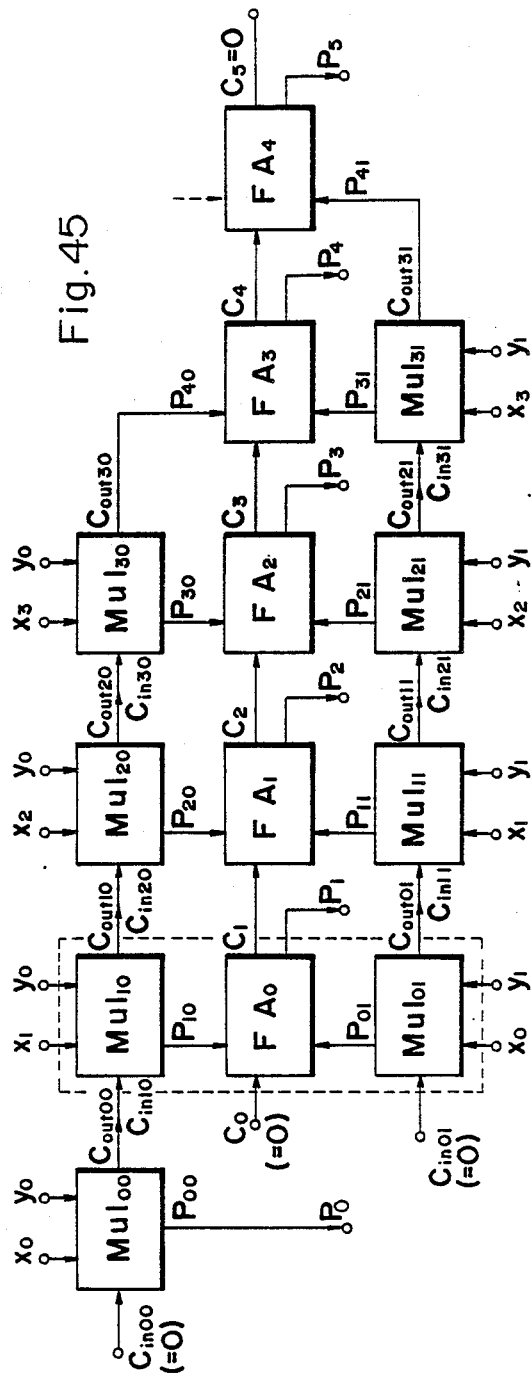
FIG. 45 is a block diagram showing an example of a circuit in which a 4-digit variable and 2-digit variable are multiplied at once.

A multiplication between a plural-digit variable and a plural-digit variable may be achieved if multiplication between a plural-digit variable and a single digit are repeated and the results of these multiplication operations are successively added by adding up the digits. However, it is also possible to multiply a plurality of digits by a plurality of digits at one time. An example of a circuit for executing such a multiplication operation is illustrated in FIG. 45 in the form of a multiplier circuit for multiplying a 4-digit variable $(x_3x_2x_1x_0)$ by a 2-digit variable $(y_1y_0)$. The circuit of FIG. 45 comprises circuits $Mul_{00}$–$Mul_{30}$ for performing the operation $(x_3x_2x_1x_0) y_0$, circuits $Mul_{01}$–$Mul_{31}$ for performing the operation $(x_3x_2x_1x_0) Y_1$, and circuits $FA_0$–$FA_4$ for adding the corresponding digits of the outputs of above circuits.

Figure 46:
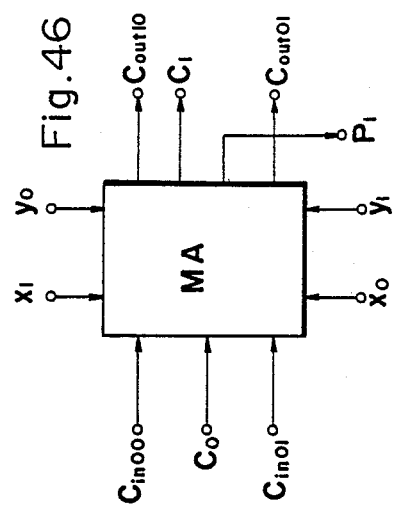
FIG. 46 shows a block in which several of the elements of FIG. 45 are consolidated.

The two multiplier circuits $Mul_{10}$, $Mul_{01}$ and adder circuit $FA_0$ enclosed by the dashed lines in FIG. 45 can be consolidated in the form of a 7-input 4-output circuit, as shown in FIG. 46, and it is possible for this circuit to be programmed in accordance with the corresponding truth tables.

(12) Multivalued full divider circuit

Figure 47:
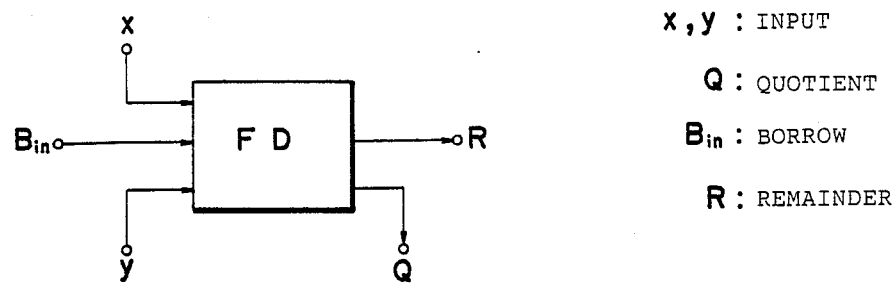
FIG. 47 is a view showing the relationship between the inputs and outputs of a multivalued full divider circuit block.

FIG. 47 shows the relationship between the inputs and outputs of a multivalued full divider circuit FD. The inputs to the circuit are the variables x, y and a borrow Bin from a higher order digit, and the outputs are the quotient Q and remainder R.

Figure 48:
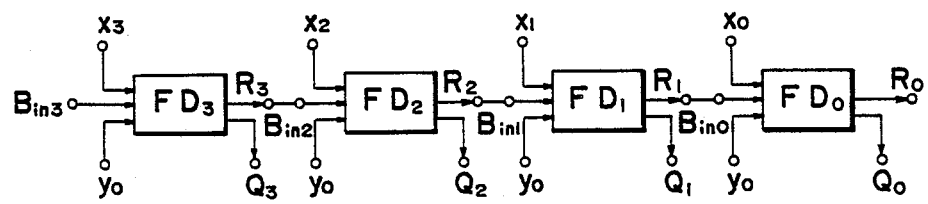
FIG. 48 is a block diagram illustrating an example in which a divider circuit which divides a 4-digit variable by a 1-digit variable is constructed by cascade-connecting the full divider circuits.
Figure 50:
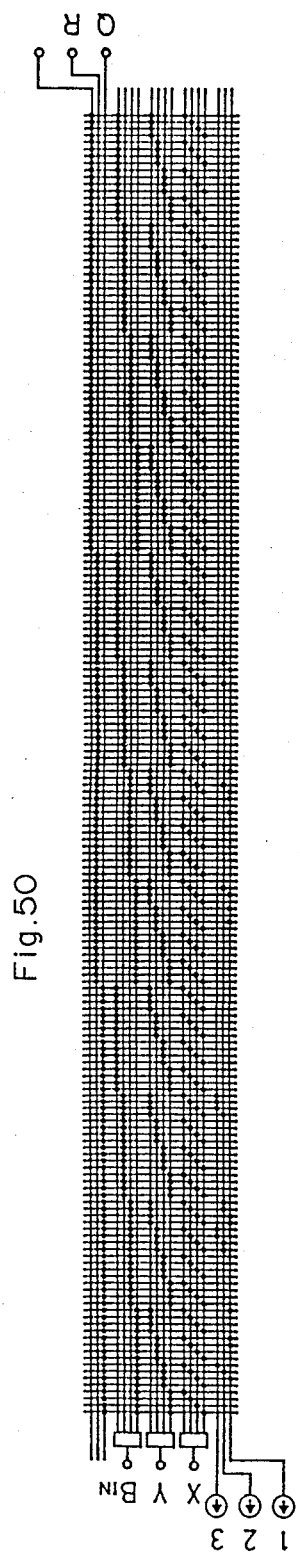
FIG. 50 is a connection diagram of a 4-valued full divider circuit.
Figure 51:
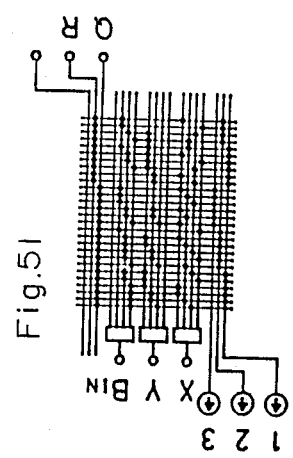
FIG. 51 is a connection diagram showing a simplification of the circuit of FIG. 50.

The truth tables of a 4-valued full divider circuit are shown in FIG. 49. FIG. 50 illustrates an example of the full divider circuit connections programmed using these truth tables, and FIG. 51 shows an example of the connections in simplified form. FIG. 48 illustrates a circuit in which four full divider circuits $FD_0$–$FD_3$, the construction whereof is identical with that of the above-described full divider circuit, are cascade-connected for dividing a 4-digit variable $(x_3x_2x_1x_0)$ by a 1-digit variable $y_0$. The remainder R of an upper order digit is inputted as the borrow Bin of a lower order digit. Though the one inputs of these circuits are $x_0$ $x_1$, $x_2$, $x_3$, the other inputs are the same, namely $y_0$. Performing the division operation gives the result $(Q_3Q_2Q_1Q_0)$, with a remainder of $R_0$.

Figure 52:
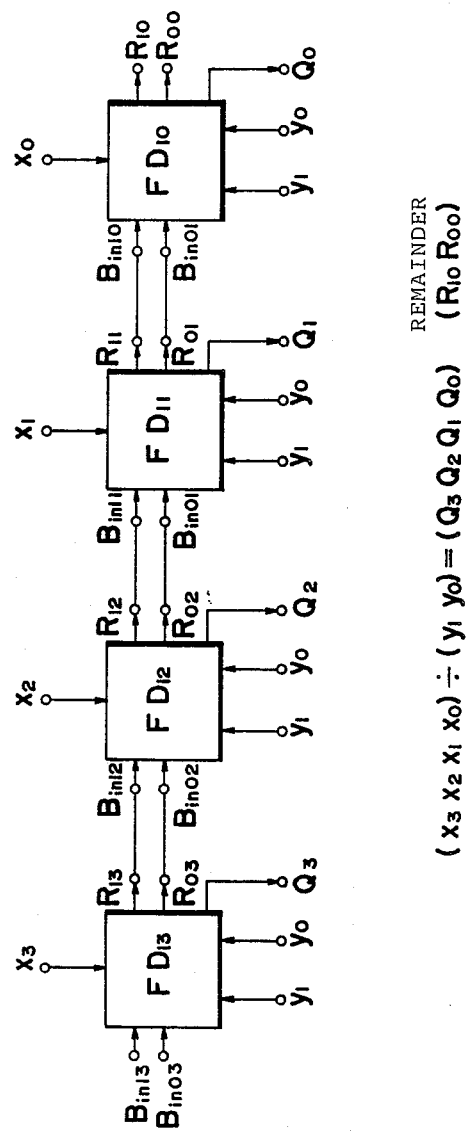
FIG. 52 is a block diagram showing the concept of a circuit for dividing a 4-digit variable by a 2-digit variable.

If a plural-digit variable is to be divided by a plural-digit variable, it is preferred that a circuit capable of performing the division at one time be constructed beforehand in accordance with truth tables conforming to the operation. FIG. 52 illustrates the concept of a circuit for dividing a 4-digit variable $(x_3x_2x_1x_0)$ by a 2-digit variable $(y_1y_0)$. The circuit is composed of four full divider circuits $FD_{10}$–$FD_{13}$ connected in cascade form, each full divider circuit having five inputs and three outputs. Specifically, the inputs are $x_i$, 2-digit variables $y_1$, $y_0$ and 2-digit borrows $Bin_{1i}$, $Bin_{0i}$, and the outputs are the quotient $Q_i$ and 2-digit remainders $R_{li}$, $R_{0i}$ (i=0–3). Truth tables of a circuit of this kind are somewhat complicated but can be prepared with ease.

(13) CMOS multivalued logic function circuit and CMOS multivalued ALU

In the above-described embodiments, n-channel MOSFETs mainly are used as the switching elements in the AND array 22 and selection array 25, though these can be replaced by p-channel MOSFETs. When a CMOSFET is employed, however, it is possible to achieve higher speed and prevent the occurrence of errors. A circuit using a CMOS will now be described.

FIGS. 53a, 53b illustrate a switching operation using an n-channel MOS, in which FIG. 53a is a circuit diagram and FIG. 53b a a waveform, diagram. In FIG. 53a, a switching element comprising an n-channel MOSFET $Q_N$ is connected between a power supply E and an output terminal (output voltage $V_0$), and the output terminal is connected to ground via a resistor $R_L$ having a large resistance value. The FET $Q_N$ has its on/off action controlled by a control signal $V_c$.

When the control voltage $V_c$ is at the H level (e.g. 5 V), the FET $Q_N$ is turned on and an H-level output voltage $V_0$ appears. When the control voltage $V_c$ falls to the L level (0 V), the FET $Q_N$ turns off and the output voltage $V_0$ also falls to the L level (0 V).

In the switching operation, the rise in the output voltage $V_0$ when the FET $Q_N$ turns on is extremely rapid, as shown in FIG. 53b. However, the power supply voltage E is voltage-divided by the resistance of the FET $Q_N$ and the resistor $R_L$ at conduction of the FET, so that the output voltage $V_0$ assumes a value lower than that of the voltage E. This is a source of error and, while presenting no particular problems in 3- or 4-valued circuits, is a major concern when circuits involve on the order of ten values. Furthermore, when the FET $Q_N$ turns off, an electric charge stored in the substrate-source capacitance $C_{SB}$ of the FET $Q_N$ is discharged through the resistor $R_L$. The problem that results is a very slow response.

FIGS. 54a and 54b illustrate a solution to the above-mentioned problems achieved by using a CMOSFET, in which FIG. 54a is a circuit diagram and FIG. 54b is a waveform diagram. In FIG. 54a, a p-channel MOSFET $Q_P$ is connected between the voltage source E and output terminal, and an n-channel MOSFET $Q_N$ is connected between the output terminal and ground. The FETs $Q_P$, $Q_N$ are both controlled by the control voltage $V_c$. The control voltage $V_c$ is bipolar (e.g. $+5$ V – $-5$ V), as shown in FIG. 54b.

Since the FET $Q_P$ is off and the FET $Q_N$ is on when the control voltage $V_c$ is at the H level ($+5$ V), the output voltage $V_0$ is at the L level (0 V) at such time. Conversely, when the control voltage $V_c$ attains the L level ($-5$ V), FET $Q_P$ turns on and FET $Q_N$ turns off. As a result, the power supply voltage E appears at the output terminal, so that the output voltage $V_0$ attains the H level (E).

Thus, the switching circuit shown in FIG. 54a has a quick response (e.g. several nsec) at both rise and decay and is error-free. This makes it possible to construct a circuit for a high radix such as 10. Another advantage is that the output resistance is low since either FET $Q_P$ or FET $Q_N$ is conducting at all times.

Though the voltage relationship would differ, it goes without saying that the FETs $Q_P$, $Q_N$ in FIG. 54a may be interchanged.

Figure 55:
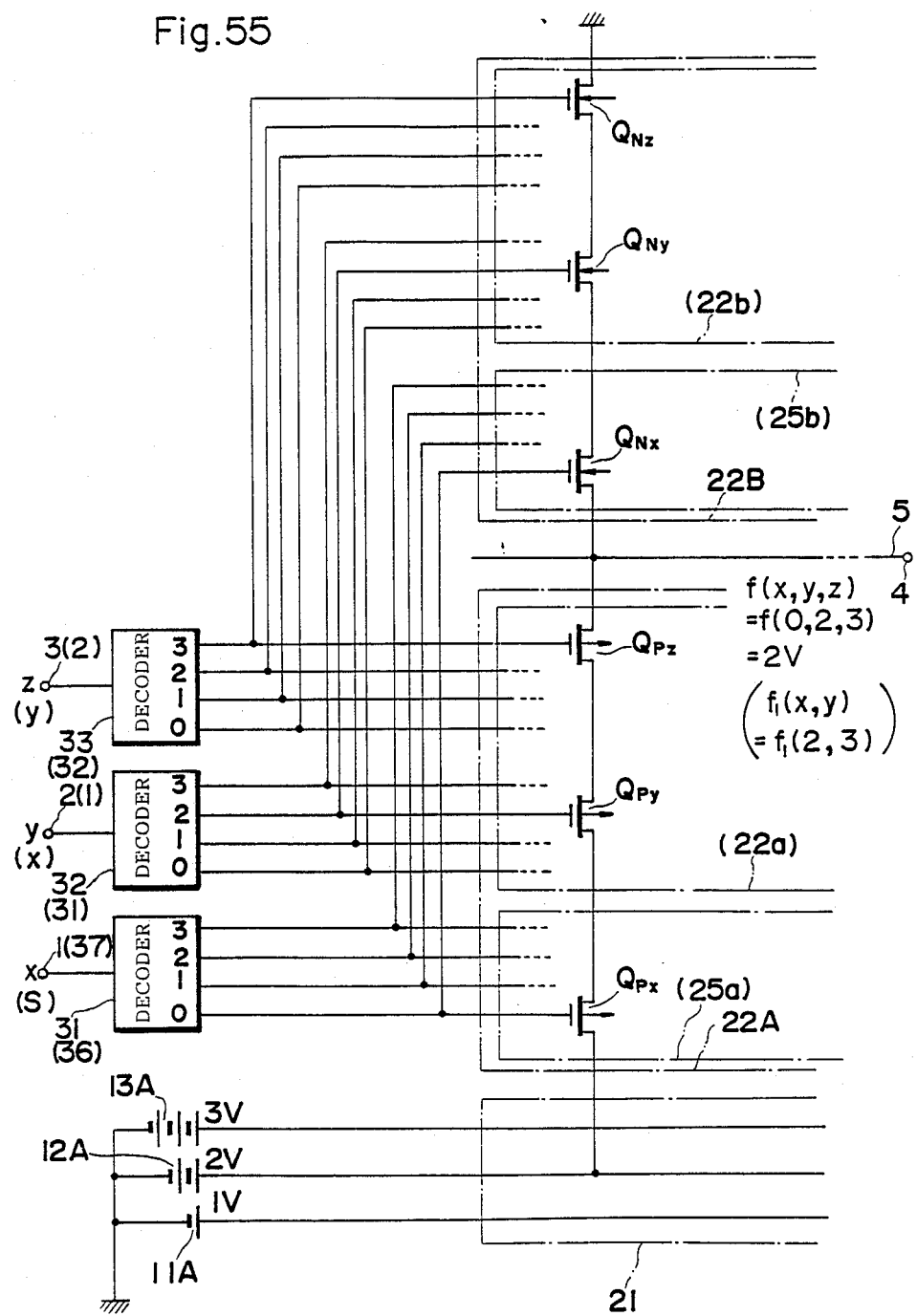
FIG. 55 is a circuit diagram illustrating an example of a CMOS multivalued logic function circuit and CMOS multivalued ALU.

FIG. 55 illustrates a multivalued logic function circuit, which corresponds to the circuits shown in FIG. 2 and the like, constructed by utilizing the CMOSFET-based switching circuit depicted in FIG. 54a. Only a portion of the circuit is shown.

A p-channel MOS AND array 22A and an n-channel MOS AND array 22B are provided in place of the aforementioned AND array 22. In the p-channel MOS AND array 22A, three p-channel MOSFETs (e.g. $Q_{Px}$, $Q_{Py}$, $Q_{Pz}$) are serially connected in each column line. These FETs are controlled by those outputs of the decoders 31, 32, 33 that arrive from the programmed connections. Similarly, in the n-channel MOS AND array 22B, three n-channel MOSFETs (e.g. $Q_{Nx}$, $Q_{Ny}$, $Q_{Nz}$) are serially connected in each column line. These FETs are controlled by the decoder outputs applied to the corresponding p-channel MOSFETs of the p-channel MOS AND array 22A. One end of each column line of the n-channel MOS AND array 22B is grounded, and the other end is connected to the output line 5. One end of each column line of the p-channel MOS AND array 22A is connected to the output line 5, and the other is connected by a program to one row line of the memory array 21. The decoders 31–33 are for outputting the abovementioned bipolar control signals. For example, when the input x is 0, the 0 output terminal of decoder 31 delivers −5 V and the other output terminals (1, 2, 3) deliver +5V. Voltage sources 11A–13A (e.g. 1 V, 2 V, respectively) are employed as the signal sources.

The portion of the circuit shown in FIG. 55 is so adapted that when x=0, y=2, z=3 holds, a voltage signal (2 V) representing a function value of logic value 2 is generated at the output terminal.

A multivalued ALU of the kind shown in FIG. 15 can also be readily constructed by using a CMOS switching circuit. For example, a 2-input 4-valued ALU can be constructed as follows using the arrangement of FIG. 55: The decoder 31 (36) is adopted for the select signal S, and the decoders 32 (31), 33(32) are adopted for the inputs x, y. Furthermore, the p-channel MOS AND array 22A is functionally divided into a p-channel MOS AND array (22a) and a p-channel MOS select array (25a). Similarly, an n-channel MOS AND array (22b) and an n-channel MOS select array (25b) are constructed by the n-channel MOS AND array 22B. It will be clear from a comparison with FIG. 15 that portions in FIG. 55 identical with or related to those shown in FIG. 15 are designated by like or related reference characters (characters with the suffix a or b attached) enclosed by parentheses. With the circuit portion shown in FIG. 55 the function (operation) $f_1$ is selected and a signal representing the operational results $f_1(x,y) = f_1(2,3) = 2$ (V) appears at the output terminal 4.

(14) Multivalued binary hybrid circuit

Figure 56:
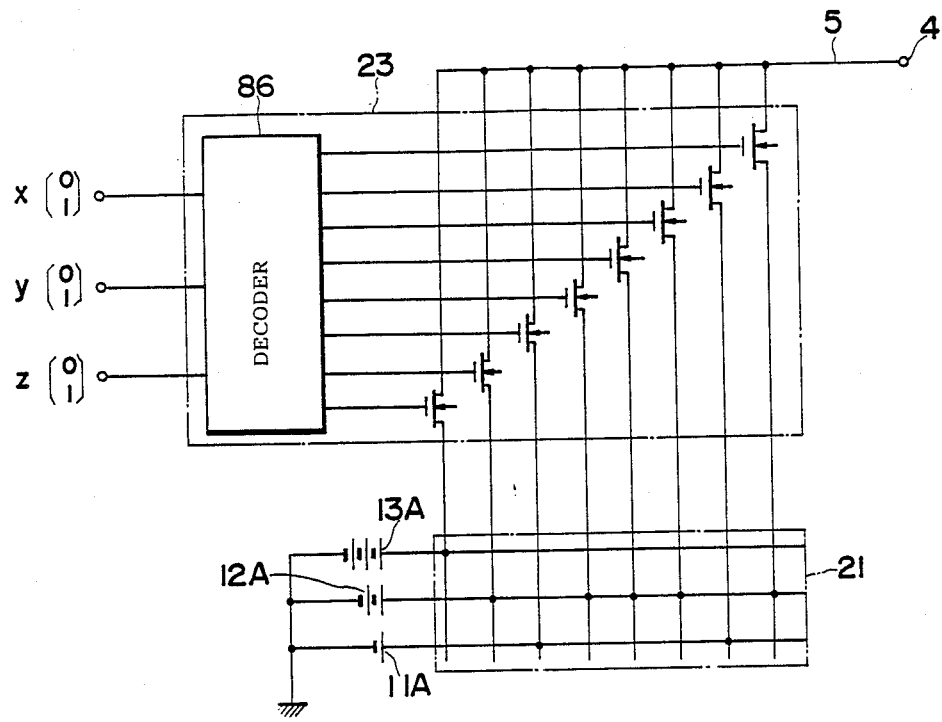
FIG. 56 is a circuit diagram illustrating an example of a multivalued binary hybrid circuit.

In a case where the memory array 21 is to be used as a simple multivalued ROM, it will suffice if the input signals x, y, z of the addressed switch 23 are binary rather than multivalued signals, as is shown in FIG. 56. In other words, the input signals x, y, z should take on values of 0, 1. In such case a decoder 86 contained in the addressed switch 23 would be well-known binary decoder. A circuit of this type is referred to as a multivalued binary hybrid circuit.

As many apparently widely different embodiments of the present invention can be made without departing from the spirit and scope thereof, it is to be understood that the invention is not limited to the specific embodiments thereof except as defined in the appended claims.

What we claim is:

1. A multivalued ALU comprising:
a plurality of multivalued signal sources for generating signals respectively representing a plurality of logic values of applied multivalued logic;
a memory array including a plurality of signal lines connected to respective ones of said signal sources, and a plurality of address line groups provided for respective ones of different functions to be implemented, each group comprising a plurality of address lines each connected to any one of the signal lines at a node by being programmed in accordance with a truth table of each function;
first selecting means for selecting any one of the address line groups by a selection signal which is for selecting a function to be implemented;
second selecting means for selecting at least one of the address lines in the selected address line group by a multivalued input signal; and
an output circuit for outputting a signal representing a multivalued logic value obtained from the address line selected by said first and second selecting means.

2. The multivalued ALU according to claim 1, wherein said memory array is field programmable.

3. The multivalued ALU according to claim 1, wherein said memory array and said first and second selecting means are mask programmable.

4. The multivalued ALU according to claim 1, wherein said multivalued signal sources are current sources.

5. The multivalued ALU according to claim 1, wherein said multivalued signal sources are voltage sources.

6. A multivalued logic function circuit comprising:
a plurality of multivalued signal sources for generating signals respectively representing a plurality of logic values of applied multivalued logic;
a memory array including a plurality of signal lines connected to respective ones of said signal sources, and a plurality of address lines each connected to any one of the signal lines at a side being programmed in accordance with a given truth table;
an addressed switch for selectively rendering any one of the address lines conductive responsive to a plurality of multivalued input signals; and
an output line connected to all of the address lines on the output side of said addressed switch for outputting a signal representing a multivalued logic value.

7. The multivalued logic function circuit according to claim 6, wherein said memory array is field programmable and said addressed switch includes a plurality of switching elements connected in a predetermined pattern representing all combinations of said input signals.

8. The multivalued logic function circuit according to claim 6, wherein said memory array and said addressed switch are mask programmable.

9. The multivalued logic function circuit according to claim 6, wherein said multivalued signal sources are multivalued current sources.

10. The multivalued logic function circuit according to claim 9, further comprising a series circuit, which includes a mode changeover switch and a resistor, connected in parallel with the output line or in series with the signal lines of said memory array, whereby said multivalued logic function circuit can operate in both a current mode and voltage mode.

11. The multivalued logic function circuit according to claim 9, wherein said plurality of multivalued current sources includes one unit current input terminal and a multiple-output current mirror connected to said unit current input terminal.

12. A programmable multivalued logic function circuit comprising:
a plurality of multivalued signal sources for generating signals respectively representing a plurality of logic values of applied multivalued logic;
a programmable memory array including a plurality of signal lines connected to respective ones of said signal sources, and address lines, the number whereof is equivalent to a number of combinations of input signals, arranged to intersect the signal lines at points of intersection, wherein nodes are programmed at said points of intersection;
an addressed switch for selectively rendering any one of the address lines conductive by a multivalued input signal; and an output line connected to all of the address lines on the output side of said addressed switch for outputting a signal representing a multivalued logic value.

13. A programmable multivalued logic function circuit according to claim 12, further comprising a signal line selecting circuit which includes switching elements connected between respective ones of said signal lines and a programming terminal, and a decoder which decodes a selection signal for outputting a signal which controls a corresponding switching element.

14. A multivalued logic multiple-function circuit comprising:
 a plurality of multivalued signal sources for generating signals respectively representing a plurality of logic values of applied multivalued logic;
 a memory array including a plurality of signal lines connected to respective ones of said signal sources, and a plurality of address lines provided for respective ones of multivalued logic functions, each of said address lines being connected to any one of the signal lines at a node by being programed in accordance with a plurality of truth tables representing a plurality of multivalued logic functions;
 an addressed switch for selectively rendering any one of the address lines conductive for each of the plurality of multivalued logic function in response to particular ones of a plurality of multivalued input signals; and
 a sum array which includes a plurality of output lines each connected to all of said address lines provided for a particular one of the plurality of multivalued logic functions on an output side of said addressed switch.

15. The multivalued logic multiple-function circuit according to claim 14, wherein when there are multivalued logic functions having the same truth table value for the same combination of input signals in a voltage mode of operation, the output lines of these multivalued logic functions are connected commonly to the address line, in said sum array, which is for obtaining a signal representing said truth table value.

* * * * *